United States Patent
Gross et al.

(10) Patent No.: US 10,193,578 B2
(45) Date of Patent: Jan. 29, 2019

(54) FLEXIBLE POLAR ENCODERS AND DECODERS

(71) Applicant: The Royal Institution for the Advancement of Learning / McGill University, Montreal (CA)

(72) Inventors: Warren Gross, Montreal (CA); Gabi Sarkis, Mississauga (CA); Pascal Giard, Ste-Marthe-sue-le-Lac (CA); Camille Leroux, Pessac (FR)

(73) Assignee: THE ROYAL INSTITUTION FOR THE ADVANCEMENT OF LEARNING / MCGILL UNIVERSITY, Montreal (CA)

( * ) Notice: Subject to any disclaimer, the term of this patent is extended or adjusted under 35 U.S.C. 154(b) by 0 days.

(21) Appl. No.: 14/796,088

(22) Filed: Jul. 10, 2015

(65) Prior Publication Data
US 2016/0013810 A1 Jan. 14, 2016

Related U.S. Application Data

(60) Provisional application No. 62/022,883, filed on Jul. 10, 2014.

(51) Int. Cl.
H03M 13/00 (2006.01)
H03M 13/09 (2006.01)
(Continued)

(52) U.S. Cl.
CPC ......... *H03M 13/617* (2013.01); *H03M 13/09* (2013.01); *H03M 13/13* (2013.01);
(Continued)

(58) Field of Classification Search
CPC ........... H03M 13/617; H03M 13/6561; H03M 13/13; H03M 13/09; H03M 13/611; H03M 13/451
See application file for complete search history.

(56) References Cited

U.S. PATENT DOCUMENTS 6,005,897 A * 12/1999 McCallister ........ H03M 13/253
375/265
9,362,950 B2 * 6/2016 Wiley ................. H03M 13/091
(Continued)

OTHER PUBLICATIONS

Chen et al., IET Commun., 2013, vol. 7, Iss. 7, pp. 620-627, "Practical polar code construction over parallel channels".*
(Continued)

Primary Examiner — April Y Blair
Assistant Examiner — Rong Tang
(74) Attorney, Agent, or Firm — Norton Rose Fulbright Canada LLP

(57) ABSTRACT

Modern communication systems must cope with varying channel conditions and differing throughput constraints. Polar codes despite being the first error-correcting codes with an explicit construction to achieve the symmetric capacity of memoryless channels are not currently employed against other older coding protocols such as low-density parity check (LDPC) codes as their performance at short/ moderate lengths has been inferior and their decoding algorithm is serial leading to low decoding throughput. Accordingly techniques to address these issues are identified and disclosed including decoders that decode constituent codes without recursion and/or recognize classes of constituent directly decodable codes thereby increasing the decoder throughput. Flexible encoders and decoders supporting polar codes of any length up to a design maximum allow adaptive polar code systems responsive to communication link characteristics, performance, etc. while maximizing throughput. Further, designers are provided flexibility in implementing either hardware or software implementations.

18 Claims, 9 Drawing Sheets

(51) Int. Cl.
*H03M 13/13* (2006.01)
*H03M 13/45* (2006.01)
(52) U.S. Cl.
CPC ....... *H03M 13/451* (2013.01); *H03M 13/611* (2013.01); *H03M 13/6561* (2013.01)

(56) References Cited

U.S. PATENT DOCUMENTS

| | | | | |
|---|---|---|---|---|
| 2004/0022336 | A1* | 2/2004 | Yu | H04L 1/005 375/346 |
| 2013/0117344 | A1 | 5/2013 | Gross et al. | |
| 2014/0108748 | A1* | 4/2014 | Lee | H03M 13/1111 711/154 |
| 2014/0208183 | A1* | 7/2014 | Mahdavifar | H03M 13/296 714/755 |
| 2015/0077277 | A1* | 3/2015 | Alhussien | H03M 13/618 341/67 |
| 2015/0091742 | A1* | 4/2015 | Ionita | H04L 25/4917 341/57 |
| 2015/0103947 | A1* | 4/2015 | Shen | H04B 1/04 375/295 |

OTHER PUBLICATIONS

Chen et al., IET Commun., Jan. 30, 2013, vol. 7, Iss. 7, pp. 620-627, "Practical polar code construction over parallel channels".*
Chen et al., IET Commun., 2013, vol. 7, Iss. 7, pp. 620-627, "Practical polar code construction over parallel channels", hereinafter Chen.*
Yoo et al., "Partially Parallel Encoder Architecture for Long Polar Codes", IEEE Trans Circuits Syst. II, vol. 62(3), Mar. 2015, pp. 306-310.
A. Mishra et al., "A Successive Cancellation Decoder ASIC for a 1024-bit Polar Code in 180nm CMOS", 2012 IEEE pp. 205-208.
G. Falcão et al., "How GPUs Can Outperform ASICs for Fast LDPC Decoding", ACM Proc. of the 23rd Intl. Conf. on, 2009, pp. 390-399.
A. J. Raymond et al., "A Scalable Successive-Cancellation Decoder for Polar Codes", 2014 IEEE., pp. 1-9.
G. Sarkis et al., "Fast Polar Decoders: Algorithm and Implementation", 2014 IEEE, pp. 1-12.
G. Sarkis et al., "Increasing the Throughput of Polar Decoders", 2013 IEEE, pp. 1-4.
K. Niu et al., "Stack decoding of polar codes", Electronics letters, vol. 48, No. 12, pp. 695-697, 2012.
K. Niu aet al., "CRC-Aided Decoding of Polar Codes", IEEE Commun. Lett., vol. 16, No. 10, pp. 1668-1671, 2012.
V. Torres et al., "Fully-parallel LUT-based (2048,1723) LDPC code decoder for FPGA", in Electronics, Circuits and Systems (ICECS), 2012 19th IEEE International Conference on, 2012, pp. 408-411.
A Pamuk et al., "A Two Phase Successive Cancellation Decoder Architecture for Polar Codes", in Proc. IEEE International Symposium on Information Theory ISIT 2013, Jul. 2013, pp. 957-961.
A. Eslami et al., "On bit error rate performance of polar codes in finite regime", in Proc. 48th Annual Allerton Conf. Communication, Control, and Computing (Allerton), 2010, pp. 1-7.
S. B. Korada, "Polar Codes for Channel and Source coding", Ph.D Dissertation, EPFL, 2009, 181 pages.

P. Chicoine, et al., "Hard disk drive long data sector white paper", Technical report, The International Disk Drive Equipment and Materials Association (IDEMA), Tech. Rep., 2007, pp. 1-26.
C. Condo et al., "VLSI Implementation of a Multi-mode Turbo/ LPDC Decoder Architecture", IEEE Trans.Circuits Syst. I, vol. 60(6), pp. 1441-1454.
G. Wang et al., "High throughput low latency LDPC decoding on GPU for SDR systems", in Sign. and Inf. Proc. (GlobalSIP), 1st IEEE Glob. Conf., 2013, to appear, 4 pages.
C. Leroux et al., "A semi-parallel successive-cancellation decoder for polar codes", IEEE Trans. Signal Process., vol. 61, No. 2, pp. 1-11, 2013.
J. Snyders et al., "Maximum likelihood soft decoding of binary block codes and decoders for the Golay codes", Information Theory, IEEE Transactions on, vol. 35, No. 5, pp. 963-975, 1989.
E. Arikan, "Channel polarization: A method for constructing capacity-achieving codes", in Inf. Theory (ISIT). IEEE Intl. Symp. on, 2008, pp. 1173-1177.
G. Falcão et al., "Massively LDPC decoding on multicore architectures", IEEE Trans. Parallel Distrib. Syst., vol. 22, No. 2, pp. 309-322, 2011.
A. Alamdar-Yazdi et al., "A simplified successive-cancellation decoder for polar codes", IEEE Commun. Lett., vol. 15, No. 12, pp. 1378-1380, 2011.
I. Tal et al., "How to construct polar codes", CoRR, vol. abs/1105. 6164, pp. 1-21, 2011.
I. Tal et al. "List decoding of polar codes", CoRR, vol. abs/1206. 0050, pp. 1-11, 2012.
B. Li et al., "An adaptive successive cancellation list decoder for polar codes with cyclic redundancy check", IEEE Commun. Lett., vol. 16, No. 12, pp. 1-4, 2012.
H. Mandavifar et al., "On the construction and decoding of concatenated polar codes", in IEEE Int. SA Semi-Parallel Successive-Cancellationymp. on Inf. Theory (ISIT), 5 pages, 2013.
P. Giard et al., "Fast software polar decoders", in IEEE Int. Conf. on Acoustics, Speech, and Signal Process. (ICASSP), 2014, to appear, 5 pages.
G. Sarkis et al., "Flexible and Low-Complexity Encoding and Decoding of Systematic Polar Codes", IEEE Transactions on Communications 64(7), pp. 1-13.
G. Falcão et al., "LDPC decoders for the WiMAX (IEEE 802.16e) based on multicore architectures", in WIMAX New Developments. Upena D Dalal and Y P Kosta (Ed.), pp. 133-150, 2009.
E. Arikan, "Channel polarization: A method for constructing capacity-achieving codes for symmetric binary-input memoryless channels", IEEE Trans. Inf. Theory, vol. 55, No. 7, pp. 1-23, 2009.
D. Chase, "A Class of algorithms for decoding block codes with channel measurement information", IEEE Trans. Inf. Theory, vol. 18, No. 1, pp. 170-182, 1972.
E. Arikan, "Systematic polar coding", IEEE Commun. Lett., vol. 15, No. 8, pp. 860-862, 2011.
M. Kretz et al., "Vc: A C++ library for explicit vectorization", Software: Practice and Experience, vol. 42, No. 11, pp. 1-4, 2012.
B. Yuan et al., "Low-latency successive-cancellation polar decoder architectures using 2-bit decoding", IEEE Trans. Circuits Syst. I, vol. 61, No. 4, pp. 1241-1254, Apr. 2014.
R. Li et al., "A multi-standard efficient column-layered LDPC decoder for software defined radio on GPUs", in Sign. Proc. Advances in Wireless Commun. (SPAWC), IEEE 14th Workshop on, 2013, pp. 724-728.
T. H. Cormen et al., "Introduction to Algorithms", 3rd ed. The MIT Press, 2009.

* cited by examiner

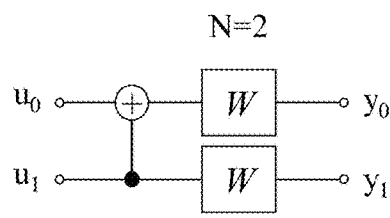
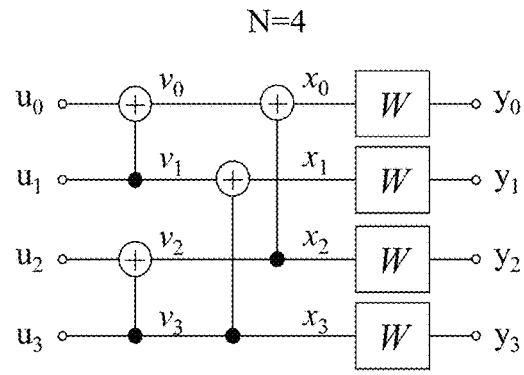
Figure 1A  Figure 1B
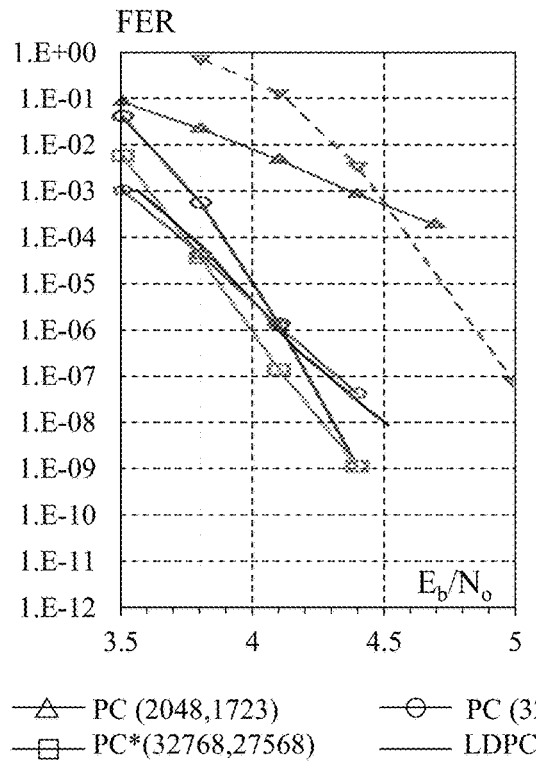
Figure 2A
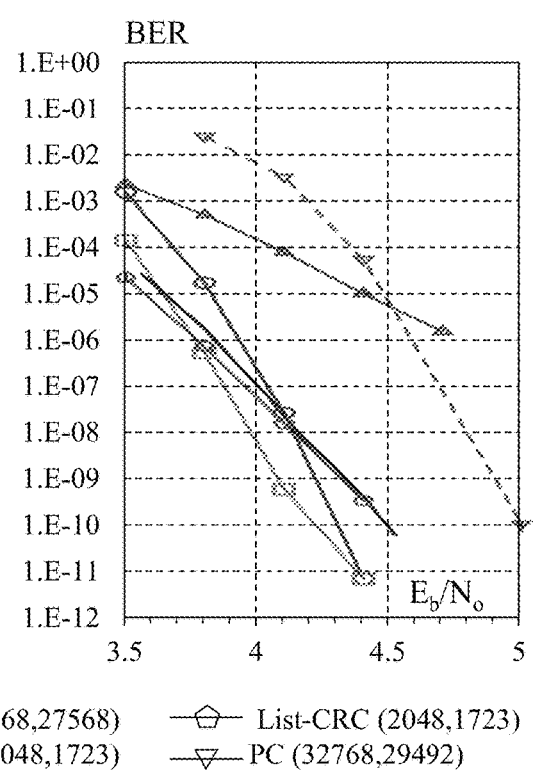
Figure 2B
—△— PC (2048,1723)  —◯— PC (32768,27568)  —⬠— List-CRC (2048,1723)
—☐— PC*(32768,27568)  ——— LDPC(2048,1723)  —▽— PC (32768,29492)

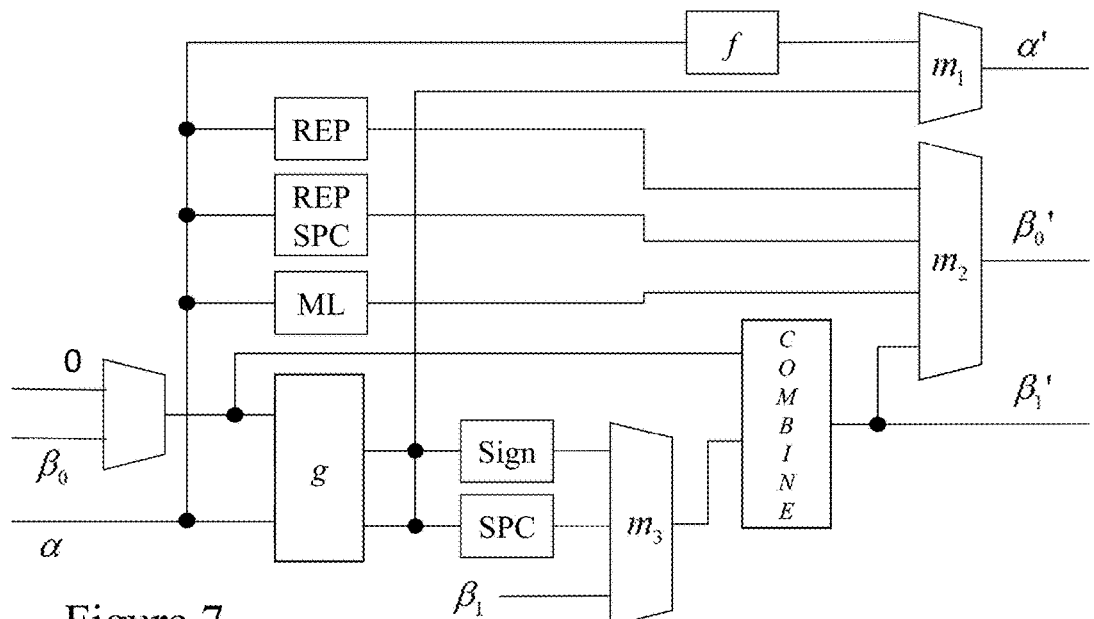
Figure 7
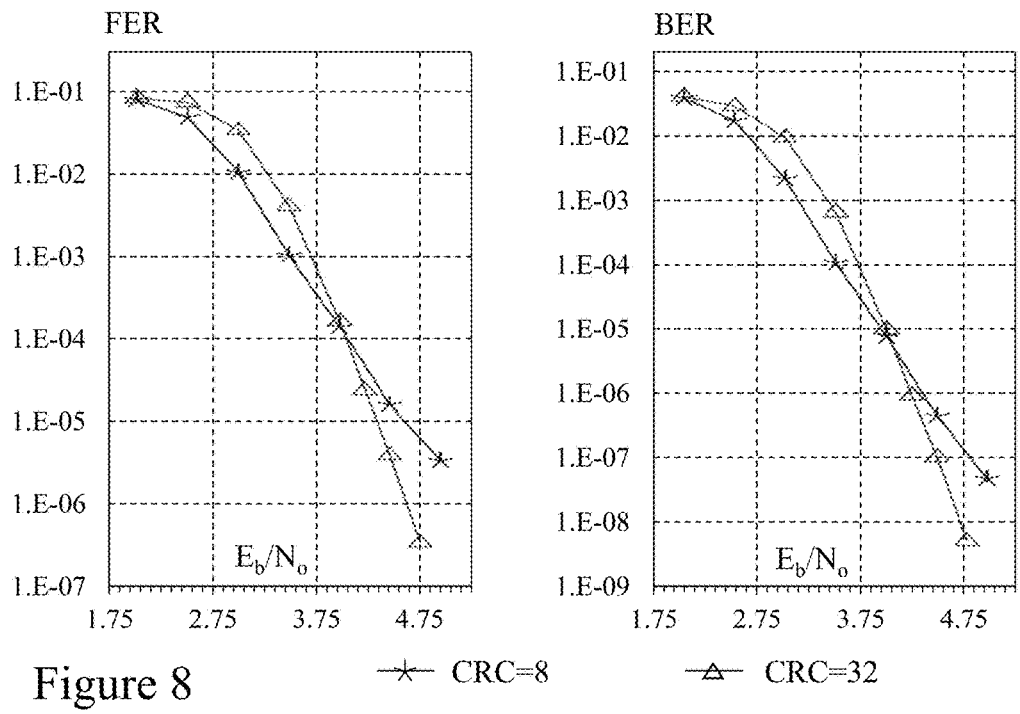
Figure 8 —✳— CRC=8 —△— CRC=32

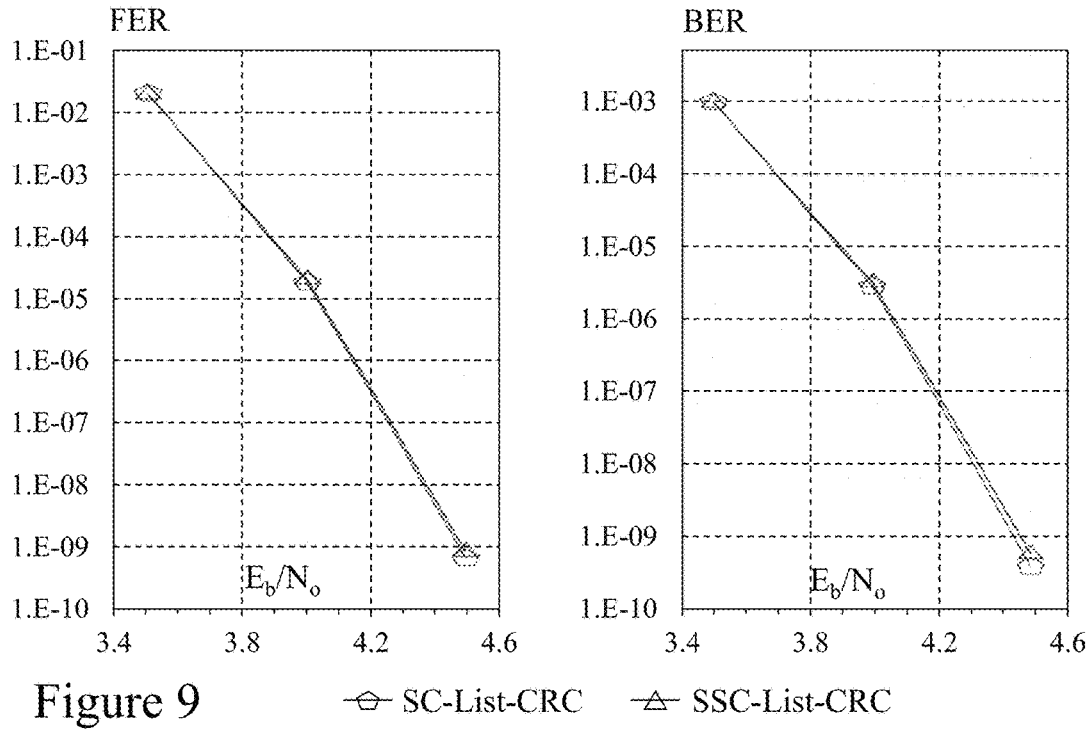
Figure 9 — SC-List-CRC — SSC-List-CRC
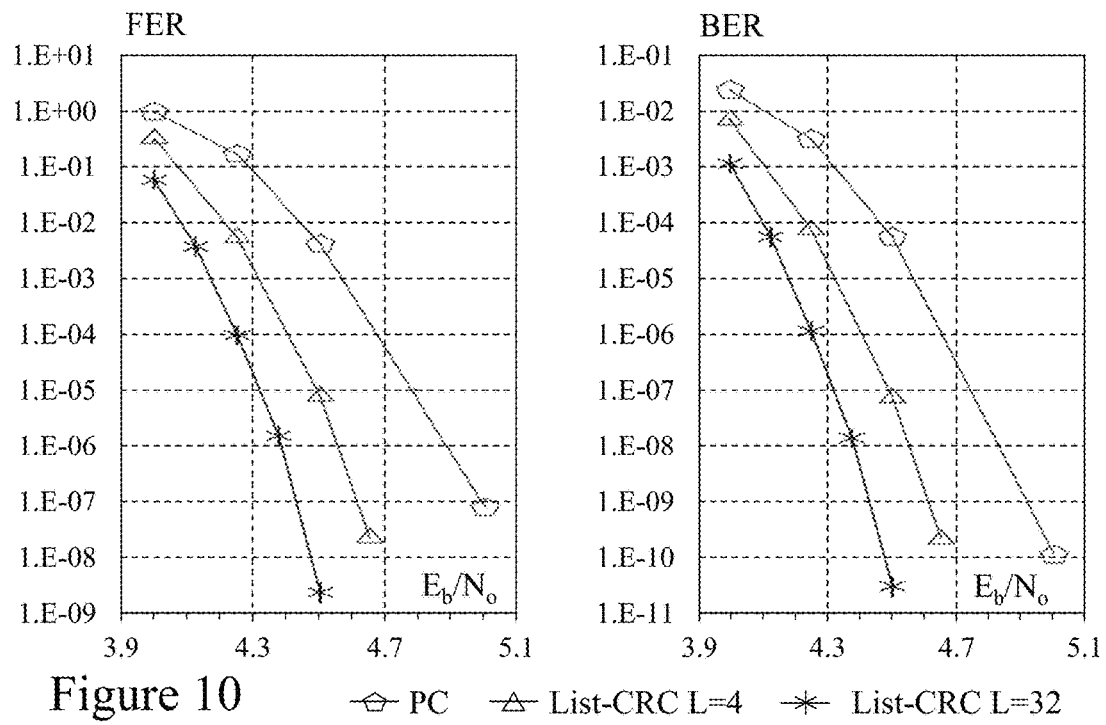
Figure 10 — PC — List-CRC L=4 — List-CRC L=32

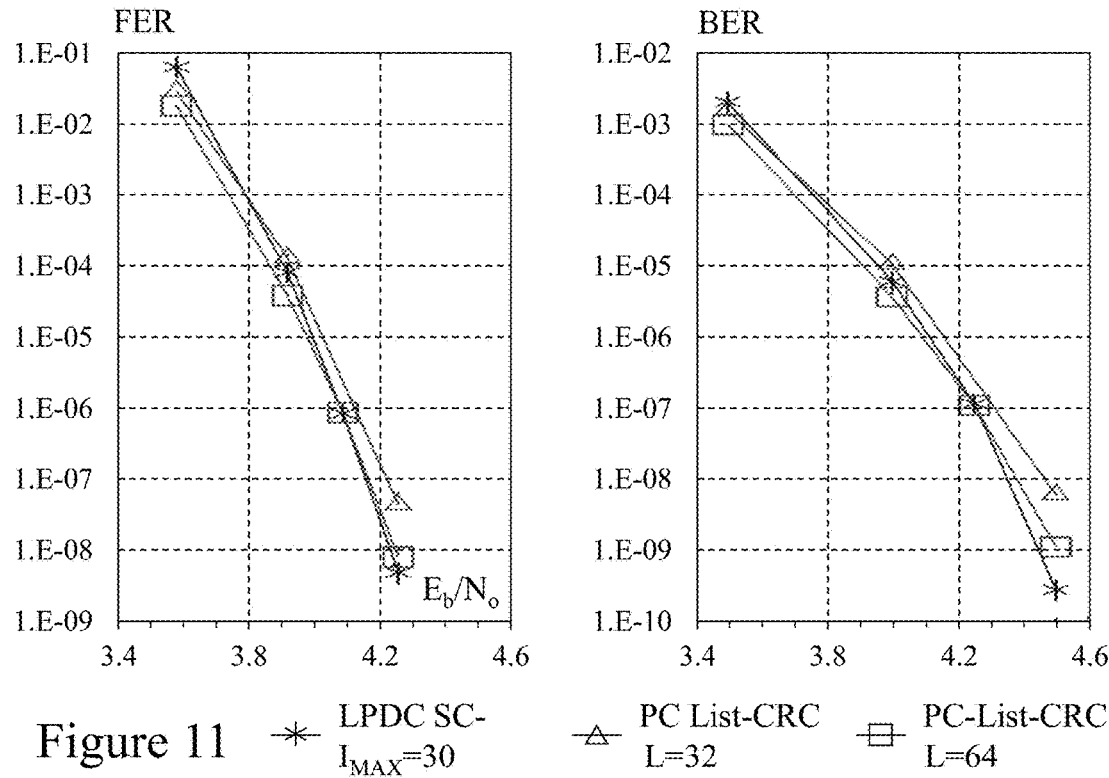
Figure 11  — ∗ LPDC SC-$I_{MAX}$=30   △ PC List-CRC L=32   □ PC-List-CRC L=64
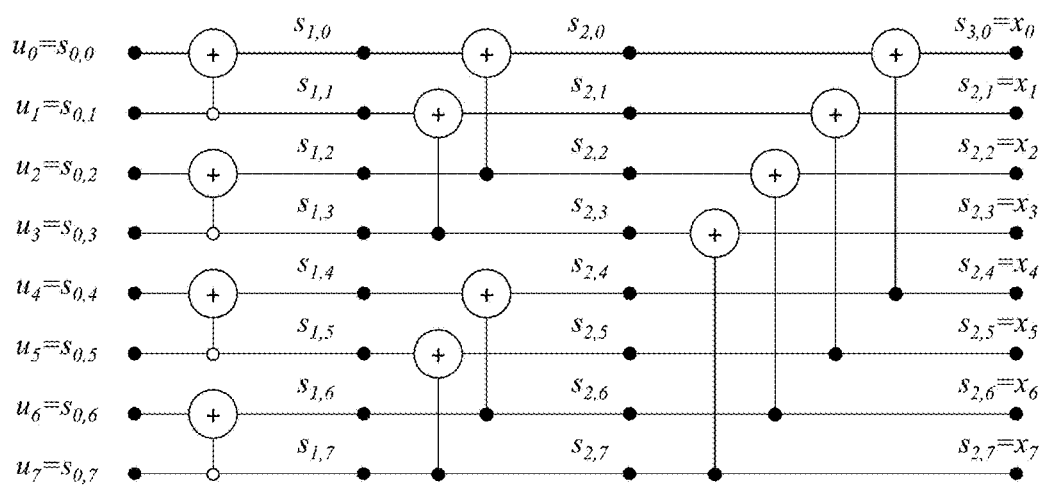
Figure 12

FLEXIBLE POLAR ENCODERS AND DECODERS

CROSS-REFERENCE TO RELATED APPLICATIONS

This patent application claims the benefit of U.S. Provisional Patent Application 62/022,883 filed Jul. 10, 2014 entitled "Fast Polar Encoder and Decoder", the entire contents of which are included by reference.

FIELD OF THE INVENTION

This invention relates to polar encoders and decoders for communications and more particularly to methods, algorithms and architectures providing increased throughput and flexible encoders and decoders.

BACKGROUND OF THE INVENTION

Modern communication systems must cope with varying channel conditions and differing throughput constraints. Polar codes are the first error-correcting codes with an explicit construction to provably achieve the symmetric capacity of memoryless channels unlike currently employed coding such as low-density parity check (LDPC) codes. They have two properties that are of interest to a variety of communications and data transmission/storage systems. First they have a very low error-floor due to their large stopping distance and secondly, low complexity implementations. However, polar codes have two drawbacks: their performance at short to moderate lengths is inferior to that of other codes, such as LDPC codes; and their low-complexity decoding algorithm, successive-cancellation (SC), is serial in nature, leading to low decoding throughput.

Within the prior art multiple methods exist to improve the error-correction performance of polar codes such as using list or list-CRC decoding to improve performance significantly. Alternatively, one can increase the length of the polar code. Among the many throughput-improving methods proposed in literature, simplified successive-cancellation (SSC) and simplified successive-cancellation with maximum-likelihood nodes (ML-SSC) offer the largest improvement over SC decoding. These achieve throughput increases by exploiting the recursive nature of polar codes, where every polar code of length N is formed from two constituent polar codes of length N/2 and decoding the constituent codes directly, without recursion, when possible. SSC decodes constituent codes of rates 0 and 1 directly and ML-SSC additionally enables the direct decoding of smaller constituent codes.

However, it would be beneficial to provide system designers with polar codes, encoders, and decoders that offered even better performance than that within the prior art. Accordingly, it would be beneficial to provide decoders that decode constituent codes without recursion thereby increasing the decoder throughput. Similarly, it would be beneficial for a decoder to recognize classes of constituent codes that can be directly decoded and process these accordingly.

It would be further beneficial to provide designers with encoders and/or decoders that are flexible rather than targeted to a specific polar code. Accordingly, it would be beneficial for such encoders and/or decoders to encode/decode any polar code of any length, n, up to a design maximum, $n_{MAX}$. Beneficially, such flexibility allows deployed systems to become adaptive to communication link characteristics, performance, etc.

It would also be beneficial to provide designers with flexibility in implementing either hardware or software implementations according to the application such that for example high end data storage solutions may exploit hardware implementations whereas quantum key distribution may exploit software implementations.

It would also be beneficial to enhance discrete elements of prior art decoders as well as advancing new encoders and decoders. Accordingly, the inventors also present enhanced approximation algorithms for improved error correction performance.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to mitigate limitations within the prior art relating to polar encoders and decoders for communications and more particularly to methods, algorithms and architectures providing increased throughput and flexible encoders and decoders.

In accordance with an embodiment of the invention there is provided a method of encoding data comprising:
providing a polar encoder for encoding a polar code of maximum length $n_{MAX}$; and
extracting at a predetermined point within the polar coder data relating to a polar code of length $n \leq n_{MAX}$, the predetermined point being defined by the polar code length n.

In accordance with an embodiment of the invention there is provided a system for encoding data comprising:
a polar encoder for encoding a polar code of maximum length $n_{MAX}$; and
an extraction circuit for extracting at a predetermined point within the polar coder data relating to a polar code of length $n \leq n_{MAX}$, the predetermined point being defined by the polar code length n.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIGS. 1A and 1B depict the structure of polar codes for N=2 and N=4

FIGS. 2A and 2B depicts error-correction performance of polar codes and low-density parity codes based upon prior art decoders;

FIG. 7 depicts an architecture of the data processing unit employed by a decoder according to an embodiment of the invention presented in FIG. 6;

FIG. 8 depicts the effect of cyclic redundancy check (CRC) length on the error-correction performance of a (1024, 860) prior art List-CRC decoder with L=128;

FIG. 9 depicts the error-correction performance with L=32 of a prior art (2048, 1723) SC-List-CRC decoder with an (2048, 1723) SSC-List-CRC decoder according to an embodiment of the invention;

FIG. 10 depicts the error-correction performance of a (32768, 29492) polar code decoder according to an embodiment of the invention with a prior art (32768, 29492) List-CRC decoders at different list sizes;

FIG. 11 depicts the error-correction performance of a (2048, 1723) LDPC decoder according to the prior art with a (2048, 1723) List-CRC decoder according to an embodiment of the invention for L=32;

FIG. 12 depicts a systematic encoder for an (8, 5) polar code according to the prior art;

DETAILED DESCRIPTION

Figures 3A, 3B, 3C:
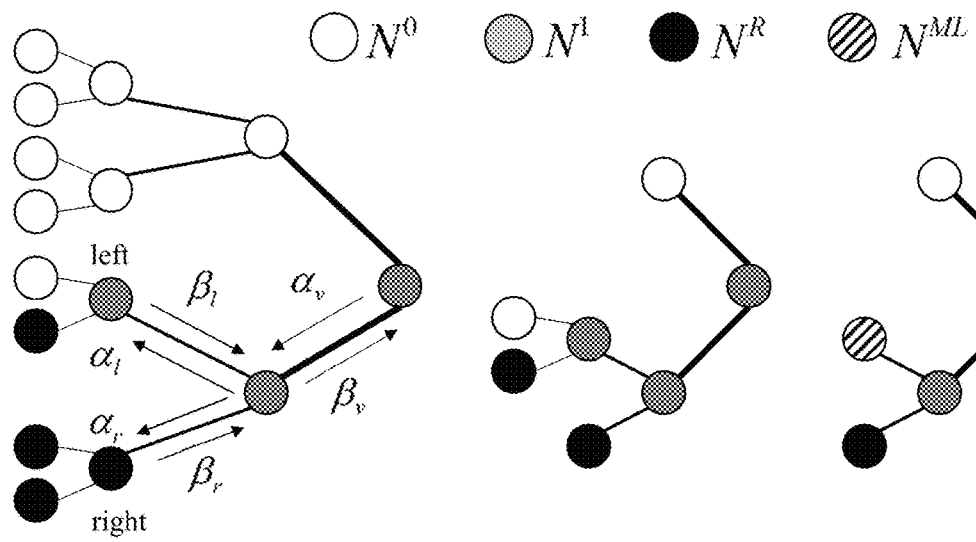
FIGS. 3A to 3C depict decoder trees corresponding to the successive cancellation (SC), simplified SC (SSC), and maximum likelihood SSC (ML-SSC) respectively.

The present invention is directed to polar encoders and decoders for communications and more particularly to polar encoders and decoders for communications and more particularly to methods, algorithms and architectures providing increased throughput and flexible encoders and decoders.

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

A: Direct Constituent Code Decoding for Fast Polar Decoders

A.1: Polar Codes

A.1.1. Construction of Polar Codes

By exploiting channel polarization, polar codes approach the symmetric capacity of a channel as the code length, N, increases. The polarizing construction when N=2 is shown in FIG. 1A, where the probability of correctly estimating bit $u_0$ decreases; while that of bit $u_1 u1$ increases compared to when the bits are transmitted without any transformation over the channel W. Channels can be combined recursively to create longer codes, such as depicted in FIG. 1B where N=4. As N→∞, 1 (perfectly reliable) or 0.5 (completely unreliable), and the proportion of reliable bits approaches the symmetric capacity of W.

To create a (N,k) polar code, N copies of the channel W are transformed using the polarizing transform and the k most reliable bits, called the information bits, are used to send information bits; while the N–k least reliable bits, called the frozen bits, are set to 0. Determining the locations of the information and frozen bits depends on the type and conditions of W. Therefore, a polar code is constructed for a given channel and channel condition. A polar code of length N can be represented using a generator matrix, $G_N = F_N = F_2^{\otimes \log_2 N}$, where $$F_2 = \begin{bmatrix} 1 & 0 \\ 1 & 1 \end{bmatrix}$$

and ⊗ is the Kronecker power. The frozen bits are indicated by setting their values to 0 in the source vector u.

Polar codes can be encoded systematically to improve bit error-rate (BER) and are a natural fit for the Simplified Successive Cancellation (SSC) and Maximum Likelihood-SSC (ML-SSC) algorithms, see inventors work in US Patent Application 2013/0,117,344 entitled "Methods and Systems for Decoding Polar Codes". If bit-reversed indexing is used, the generator matrix is changed by multiplying it with a bit-reversal operator B, so that G=B·F. The inventors accordingly exploit natural indexing to review and introduce algorithms for reasons of clarity. Further, the inventors describe and depict the exploitation of systematic encoding and bit-reversal but without requiring the use of any interleavers.

A.1.2. Successive-Cancellation (SC) Decoding

Polar codes achieve the channel capacity asymptotically in code length when decoded using the successive-cancellation (SC) decoding algorithm, which sequentially estimates the bits $\hat{u}_i$, where 0≤i≤N, using the channel output y and the previously estimated bits, $\hat{u}_0$ to $\hat{u}_{i-1}$, denoted $\hat{u}_0^{i-1}$, according to Equation (1) wherein $\lambda_{ui}$ is the log-likelihood ratio (LLR) defined as Equation (2A) which may be calculated recursively using the min-sum (MS) approximation according to Equations (2B) and (2C).

$$\hat{u}_i = \begin{cases} 0 & \text{if } \lambda_{ui} \geq 0 \\ 1 & \text{otherwise} \end{cases} \quad (1)$$

$$\log(Pr[y, \hat{u}_o^{i-1} | \hat{u}_i = 0] / Pr[y, \hat{u}_o^{i-1} | \hat{u}_i = 1]) \quad (2A)$$

$$\lambda_{u0} = f(\lambda_{v0}, \lambda_{v1}) = \text{sign}(\lambda_{v0})\text{sign}(\lambda_{v1})\min(|\lambda_{v0}|, |\lambda_{v1}|) \quad (2B)$$

$$\lambda_{u1} = g(\lambda_{v0}, \lambda_{v1}, \hat{u}_0) = \begin{cases} \lambda_{v0} + \lambda_{v1} & \text{when } \hat{u}_0 = 0 \\ \lambda_{v0} - \lambda_{v1} & \hat{u}_0 = 1 \end{cases} \quad (2C)$$

A.1.3. Performance of SC Decoding

Now referring to FIG. 2 there is depicted the error-correction performance of the (2048, 1723) 10 GBASE-T LDPC code employed in 10 Gb/s copper twisted pair according to IEEE 802.3an when compared to that of polar codes of the same rate. These results were obtained for a binary-input additive white Gaussian noise (AWGN) channel with random codewords and binary phase-shift keying (BPSK) modulation. The first observation to be made is that the performance of the (2048, 1723) polar code is significantly worse than that of the LDPC code. The polar code of length 32768, labeled PC(32768, 27568), was constructed to be optimal for $E_b/N_0$=4.5 dB and performs worse than the LDPC code until the $E_b/N_0$=4.25 dB. Past that point, it outperforms the LDPC code with a growing gap. The last polar error-rate curve, labeled PC*(32768, 27568), combines the results of two (32768, 27568) polar codes. One is constructed for 4.25 dB and used up to that point, and the other is constructed for 4.5 dB. Due to the regular structure of polar codes, it is simple to build a decoder that can decode any polar code of a given length. Therefore, it is simpler to change polar codes in a system than it is to change LDPC codes.

From these results, it can be concluded that a (32768, 27568) polar code constructed for $E_b/N_0$=4.5 dB or higher is required to outperform the (2048, 1723) LDPC one in the low error-rate region, and a combination of different polar codes can be used to outperform the LDPC code even in high error rate regions. Even though the polar code has a longer length, its decoder still has a lower implementation complexity than the LDPC decoder as will be shown by the inventors in Section A.7.

Decoding the (2048, 1723) code using the list-CRC algorithm, see for example Tal et al. in "List Decoding of Polar Codes" (Cornell University Library, http://arxiv.org/abs/1206.0050v1), with a list size of 32 and a 32-bit CRC, reduces the gap with the LDPC code to the point where the two codes have similar performance as shown in FIG. 2. However, in spite of this improvement, the inventors do not discuss list-CRC decoding in this work as it cannot directly accommodate the proposed throughput-improving techniques, which are designed to provide a single estimate instead of a list of potential candidates. However, the inventors have established that adaptation of the techniques discussed can be applied to list decoding.

The throughput of SC decoding is limited by its serial nature, the fastest implementation known to the inventors is currently an ASIC decoder for a (1024, 512) polar code with an information throughput of 48.75 Mbps when running at 150 MHz, whilst the fastest decoder for a code of length 32768 is FPGA-based and has a throughput of 26 Mbps for the (32768, 27568) code. This low throughput renders SC decoders impractical for most systems but as described below can be improved significantly by using the SSC or the ML-SSC decoding algorithms.

A.2: Simplified Successive Cancellation (SSC) and Maximum Likelihood-SSC Decoding A.2.1. Tree Structure of an SC Decoder A polar code of length N is the concatenation of two polar codes of length N/2. Since this construction is recursive, as mentioned in A.1 supra, a binary tree is a natural representation for a polar code where each node corresponds to a constituent code. FIG. 3A depicts the tree representation for an (8, 3) polar code where the white and black leaves correspond to frozen and information bits, respectively. A node v, corresponding to a constituent code of length $N_v$, receives a real-valued message vector, $\alpha_v$, containing the soft valued input to the constituent polar decoder, from its parent node. It calculates the soft-valued input to its left child, $\alpha_l$ using Equation (2A). Once the constituent codeword estimate, $\beta_l$, from the left child is ready, it is used to calculate the input to the right, $\alpha_r$, according to Equations (2B) and (2C) respectively. Finally, $\beta_v$ is calculated from $\beta_l$ and $\beta_r$ as Equation (4). For leaf-nodes, $\beta_v$=0 if the node is frozen. Otherwise, it is calculated using threshold detection, defined for an LLR-based by Equation (5). The input to the root node is the LLR values calculated from the channel output, and its output is the estimated systematic codeword.

$$\beta_v[i] = \begin{cases} \beta_l[i] \oplus \beta_r[i] & \text{when } i < N_v/2 \\ \beta_r[i - N_v/2] & \text{otherwise} \end{cases} \quad (4)$$

$$\beta_v = \begin{cases} 0 & \text{when } \alpha_v \geq 0 \\ 1 & \text{otherwise} \end{cases} \quad (5)$$

A.2.2. SSC and ML-SSC Decoder Trees

It is noted that a tree with only frozen leaf nodes rooted in a node $N^0$, does not need to be traversed as its output will always be a zero-vector. Similarly, it is noted that the output of a tree with only information leaf nodes rooted in $N^1$ can be obtained directly by performing threshold detection on the soft-information vector $\alpha_v$, without any additional calculations. Therefore, the decoder tree can be pruned reducing the number of node visitations and latency. The remaining nodes, denoted $N^R$ as they correspond to codes of rate 0<R<1, perform their calculations as in the SC decoder. The pruned tree for an SSC decoder is shown in FIG. 3B and requires 9 time steps compared to the 14 time steps required to traverse the SC tree in FIG. 3A.

The ML-SSC further prunes the decoder tree by using exhaustive-search maximum-likelihood (ML) decoding to decode any constituent code, C, while meeting resource constraints as established by the inventors. The (8, 3) polar decoder utilizing these $N^{ML}$ nodes, and whose tree is shown in FIG. 3C, where $N^{ML}$ is indicated with a striped pattern and is constrained to $N_v$=2, requires 7 time steps to estimate a codeword, i.e. half that of the SC decoder.

A.2.3. Performance

The inventors have established that under resource constraints the information throughput of SSC and ML-SSC decoding increases faster than linearly as the code rate increases, and approximately logarithmically as the code length increases. For example, it was estimated that for a rate 0.9 polar code of length 32768, which is constructed for $E_b/N_0$=3.47 dB, the information throughput of a decoder running at 100 MHz using SC decoding is ~45 Mbit/s and increases by 20 times to 910 Mbit/s when using ML-SSC decoding. The throughput of SSC and ML-SSC is affected by the code construction parameters as they affect the location of frozen bits, which in turn affects the tree structure of the decoder and the number of nodes that can be directly decoded. For example, constructing the rate 0.9, length 32768 polar code for an $E_b/N_0$=5.0 dB instead reduces the information throughput of the decoder to 520 Mbit/s assuming the same clock frequency of 100 MHz. Whilst this is a significant reduction, the decoder remains 11 times faster than an SC decoder. Further the inventors have established that the error-correction performance of polar codes is not tangibly altered by the use of the SSC or ML-SSC decoding algorithms.

A.2.4. Systematic Encoding and Bit-Reversal

Within the prior art it has been stated that systematic encoding and bit reversed indexing can be combined, however prior art architectures for encoders to achieve this have required the use of interleavers. In this section, the inventors review their inventive concept for presenting the information bits at the output of the encoder in the order in which they were presented by the source, without the use of interleavers. This is of importance to the SSC decoding algorithm as it presents its output in parallel and would otherwise require an N-bit parallel interleaver of significant complexity. The problem is compounded in a resource-constrained, semi-parallel SSC decoder that stores its output one word at a time in memory as two consecutive information bits might not be in the same memory word, such that memory words will be visited multiple times, significantly increasing decoding latency.

Figure 4:
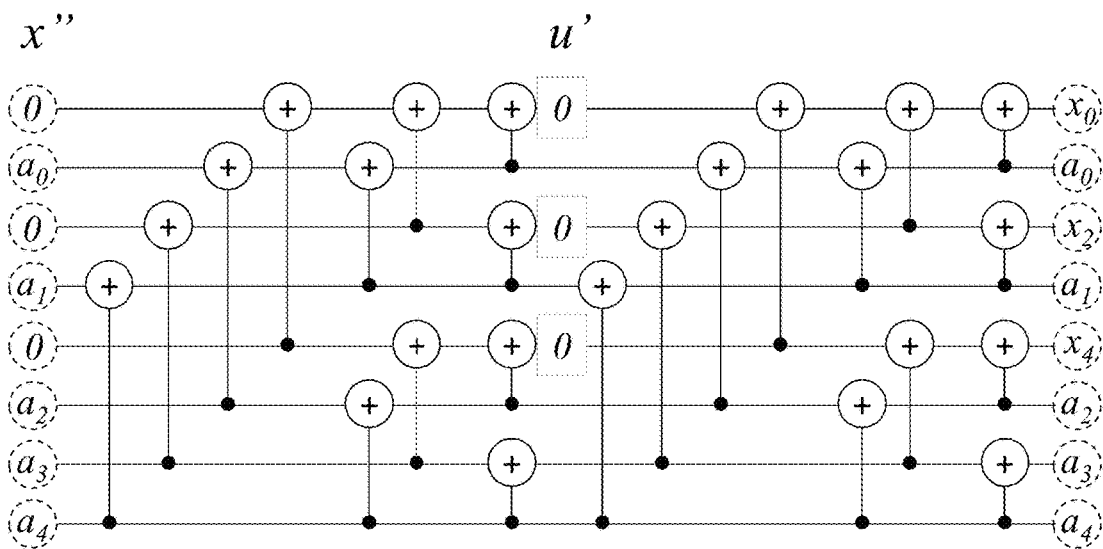
FIG. 4 depicts the structure of systematic encoding with bit-reversal according to an embodiment of the invention.

To illustrate the encoding method, FIG. 4 depicts the encoding process for an (8, 5) polar code with bit-reversal. ($x_0''$, $x_2''$, $x_4''$) are frozen and set to 0 according to the bit-reversed indices of the least reliable bits; and ($x_1''$, $x_3''$, $x_5''$, $x_6''$, $x_7''$) are set to the information bits ($a_0, a_1, a_2, a_3, a_4$). x" encoded using G to obtain the vector u', in which the bits ($u_0'$, $u_2'$, $u_4'$) are then set to zero. The resulting u' is encoded again yielding the systematic codeword x, which is transmitted over the channel sequentially, i.e. $x_0$ then $x_1$ and so on. An encoder that does not use bit-reversal will function in the same manner, except that the frozen bit indices will be (0,1,2,). An SSC decoder with P=2 will output ($\hat{x}_0, \hat{x}_1, \hat{x}_2, \hat{x}_3$) then ($\hat{x}_4, \hat{x}_5, \hat{x}_6, \hat{x}_7$), i.e. the output of the decoder is ($\hat{x}_0, \hat{a}_0, \hat{x}_2, \hat{a}_1$) then ($\hat{x}_4, \hat{a}_2, \hat{a}_3, \hat{a}_4$) where the source data estimate appears in the correct order.

A.3: Inventive Algorithm Overview

In this section the inventors explore more constituent codes that can be decoded directly and present the associated specialized decoding algorithms. The inventors present three new corresponding node types: a single-parity-check-code node, a repetition-code node, and a special node whose left child corresponds to a repetition code and its right to a single-parity-check code. The inventors also present node mergers that reduce decoder latency and summarize all the functions the new decoder should perform. Finally, the inventors study the effect of quantization on the error-correction performance of the inventive algorithm.

It should be noted that all the transformations and mergers presented within this specification preserve the polar code, i.e. they do not alter the locations of frozen and information bits. While some throughput improvement is possible via some code modifications, the resulting polar code diverges from the optimal one constructed according to the prior art. In order to maintain results that are practical, the inventors use P as a resource constraint parameter such as employed within their previous studies of semi-parallel successive-cancellation decoders for polar codes. However, since new node types are introduced, the notion of a processing element (PE) might not apply in certain cases. Therefore, the inventors redefine P so that 2P is the maximum number of memory elements that can be accessed simultaneously. Since each PE has two inputs, P PEs require 2P input values and the two definitions for P are compatible. In addition, P is as a power of two as in the inventors prior work.

A.3.1. Single-Parity-Check Nodes $N^{SPC}$

In any polar code of rate (N−1)/N, the frozen bit is always $u_0$ rendering the code a single-parity check (SPC) code, which can be observed in FIG. 1B. While the dimension of an SPC code is N−1, for which exhaustive-search ML decoding is impractical; optimal ML decoding can still be performed with very low complexity: namely the hard-decision estimate and the parity of the input are calculated; then the estimate of the least reliable bit is flipped if the parity constraint is not satisfied. The hard-decision estimate of the soft-input values is calculated using Equation (6A) whilst the parity of the input is calculated using Equation (6B). The index of the least reliable input is found using Equation (7A) whereas the output of the node is given by Equation (7B).

$$HD[i] = \begin{cases} 0 & \text{when } \alpha_v \geq 0 \\ 1 & \text{otherwise} \end{cases} \quad (6A)$$

$$\text{parity} = \bigoplus_{i=0}^{N_v-1} HD[i] \quad (6B)$$

$$j = \arg\min_i |\alpha_v[i]| \quad (7A)$$

$$\beta_v[i] = \begin{cases} HD[i] \oplus \text{parity} & \text{when } i = j \\ HD[i] & \text{otherwise} \end{cases} \quad (7B)$$

The resulting node can decode an SPC code of length $N_v > 2P$ in $(N_v/2P)+c$ steps, where $c \geq 1$ since at least one step is required to correct the least reliable estimate and others might be used for pipelining; whereas an SSC decoder requires $2\Sigma_{i=1}^{log_2 N_v} \lceil 2^i/(2P) \rceil$ steps. For example, for an SPC constituent code of length 4096, P=256, and c=4, the specialized SPC decoder requires 12 steps, whereas the SSC decoder requires 46 steps. For constituent codes of length $\leq 2P$ the decoder can provide an output immediately, or after a constant number of time steps if pipelining is used.

Large SPC constituent codes are prevalent in high-rate polar codes and a significant reduction in latency can be achieved if they are decoded quickly. Table A1 lists the number of SPC nodes, binned by size, in three different polar codes: (32768, 29492), (32768, 27568), and a lower-rate (32768, 16384), all constructed for an AWGN channel with a noise variance of $\sigma^2$=0.1936. Comparing the results for the three codes, the inventors observe that the total number of nodes decreases as the rate increases. The distribution of SPC nodes by length is also affected by code rate: the proportion of large SPC nodes decreases as the rate decreases.

TABLE A1

Number of all nodes and of SPC nodes of different sizes in three polar codes of length 32768 and rates 0.9, 0.8413, and 0.5.

| Code | All | SPC, $N_v \in$ | | | |
|---|---|---|---|---|---|
| | | (0, 8] | (8, 64] | (64, 256] | (256, 32768] |
| (32768, 29492) | 2065 | 383 | 91 | 17 | 13 |
| (32768, 27568) | 3421 | 759 | 190 | 43 | 10 |
| (32768, 16384) | 9593 | 2240 | 274 | 19 | 1 |

A.3.2. Repetition Nodes $N^{REP}$

Another type of constituent codes that can be decoded more efficiently than using tree traversal is repetition codes, in which only the last bit is not frozen. The decoding algorithm starts by summing all input values. Threshold detection is performed via sign detection, and the result is replicated and used as the constituent decoder's final output given by Equation (8).

$$\beta_v[i] = \begin{cases} 0 & \text{when } \sum_j \alpha_v[j] \geq 0 \\ 1 & \text{otherwise} \end{cases} \quad (8)$$

This decoding method requires ($N_v/2P$) steps to calculate the sum and ($N_v/2P$) steps to set the output, in addition to any extra steps required for pipelining. Two other methods employing prediction can be used to decrease latency. The first sets all output bits to 0 while accumulating the inputs, and writes the output again only if the sign of the sum is negative. The average latency of this method is 75% that of Equation (8). The second method sets half the output words to all 0 and the other half to all 1, and corrects the appropriate words when the sum is known. The resulting latency is 75% that of Equation (8). However, since the high-rate codes of interest do not have any large repetition constituent codes, the inventors have chosen to use Equation (8) directly.

Unlike SPC constituent codes, repetition codes are more prevalent in lower-rate polar codes as shown in Table A2. Moreover, for high-rate codes, SPC nodes have a more pronounced impact on latency reduction. This can be observed in Tables A1 and A2, which show that the total number of nodes in the decoder tree is significantly smaller when only SPC nodes are introduced than when only repetition nodes are introduced, indicating a smaller tree and lower latency. Yet, the impact of repetition nodes on latency is measurable; therefore, the inventors exploit them in the decoder.

TABLE A2

Number of all nodes and of repetition nodes of different sizes in three polar codes of length 32768 and rates 0.9, 0.8413, and 0.5.

| | | Repetition, $N_v \in$ | | |
|---|---|---|---|---|
| Code | All | (0, 8] | (8, 16] | (16, 32768] |
| (32768, 29492) | 2065 | 383 | 91 | 13 |
| (32768, 27568) | 3421 | 759 | 190 | 10 |
| (32768, 16384) | 9593 | 2240 | 274 | 1 |

A.3.3. Repetition-SPC Nodes $N^{REP-SPC}$

When enumerating constituent codes with $N_v \leq 8$ and $0 < k_v < 8$ for the (32768, 27568) and (32768, 29492) codes, three codes dominated the listing: the SPC code, the repetition code, and a special code whose left constituent code is a repetition code and its right an SPC one, denoted $N^{REP-SPC}$. The other constituent codes accounted for 6% and 12% in the two polar codes, respectively. Since $N^{REP-SPC}$ codes account for 28% and 25% of the total $N^R$ nodes of length 8 in the two aforementioned codes, efficiently decoding them would have a significant impact on latency. This can be achieved by using two SPC decoders of length 4, $SPC_0$ and $SPC_1$ whose inputs are calculated assuming the output of the repetition code is 0 and 1, respectively. Simultaneously, the repetition code is decoded and its output is used to generate the $N^{REP-SPC}$ output using either the output of $SPC_0$ or $SPC_1$ as appropriate. Whilst this code can be decoded using an exhaustive-search ML decoder, the proposed decoder has a significantly lower complexity.

A.3.4. Node Mergers

The $N^{REP-SPC}$ node merges an $N^{REP}$ node and an $N^{SPC}$ node to reduce latency. Similarly, it is known that $N^R$ nodes do not need not calculate the input to a child node if it is an $N^0$ node. Instead, the input to the right child is directly calculated. Another opportunity for a node merger arises when a node's right child directly provides $\beta_r$ without tree traversal: the calculation of $\alpha_r$, $\beta_r$ and $\beta_v$ can all be performed in one step, halving the latency. This is also applicable for nodes where $N_v > 2P$: P values of $\alpha_r$ are calculated and used to calculate P values of $\beta_r$, which are then used to calculate 2P values of $\beta_v$ until all values have been calculated. This can be expanded further when the left node is $N^0$. Since $\beta_l$ is known a priori to be a zero vector, $\alpha_r$ can be immediately calculated once $\alpha_v$ is available and $\beta_r$ is combined with the zero vector to obtain $\beta_v$. In all the codes that were studied, $N^R$, $N^1$, and $N^{SPC}$ were the only nodes to be observed as right children; and $N^1$ and $N^{SPC}$ are the only two that can be merged with their parent.

A.3.5. Required Decoder Functions

As a result of the many types of nodes and the different mergers, the decoder must perform many functions. Referring to Table A3 there are listed these 12 functions. For notation, 0, 1, and R are used to denote children with constituent code rates of 0, 1, and R, respectively. Having a left child of rate 0 allows the calculation of $\alpha_r$ directly from $\alpha_v$ as explained earlier. It is important to make this distinction since the all-zero output of a rate 0 code right child of rate 1 allows the calculation of $\beta_v$ directly once $\beta_l$ is known. A P-prefix indicates that the message to the parent, $\beta_v$, is calculated without explicitly visiting the right child node. The inventors note the absence of $N^0$ and $N^1$ node functions: the former due to directly calculating $\alpha_r$ and the latter to directly calculating $\beta_v$ from $\alpha_r$.

TABLE A3

A listing of the different functions performed by the proposed decoder.

| Name | |
|---|---|
| F | Calculate $\alpha_l$, Equation (2) |
| G | Calculate $\alpha_r$, Equation (3) |
| COMBINE | Combine $\beta_l$ and $\beta_r$, Equation (4) |
| COMBINE-0R | Same as COMBINE but $\beta_l = 0$ |
| G-0R | Same as G but $\beta_l = 0$ |
| P-R1 | Calculate $\beta_v$, Equations (3), (5) then (4) |
| P-RSPC | Calculate $\beta_v$, Equations (3), (7) then (4) |
| P-01 | Same as P-R1 but $\beta_l = 0$ |
| P-0SPC | Same as P-RSPC but $\beta_l = 0$ |
| ML | Calculate $\beta_v$ using exhaustive-search ML decoding |
| REP | $\beta_v$ using Equation (8) |
| REP-SPC | $\beta_v$ as shown in Section A.3.3 |

A.3.6 Performance with Quantization

Figure 5:
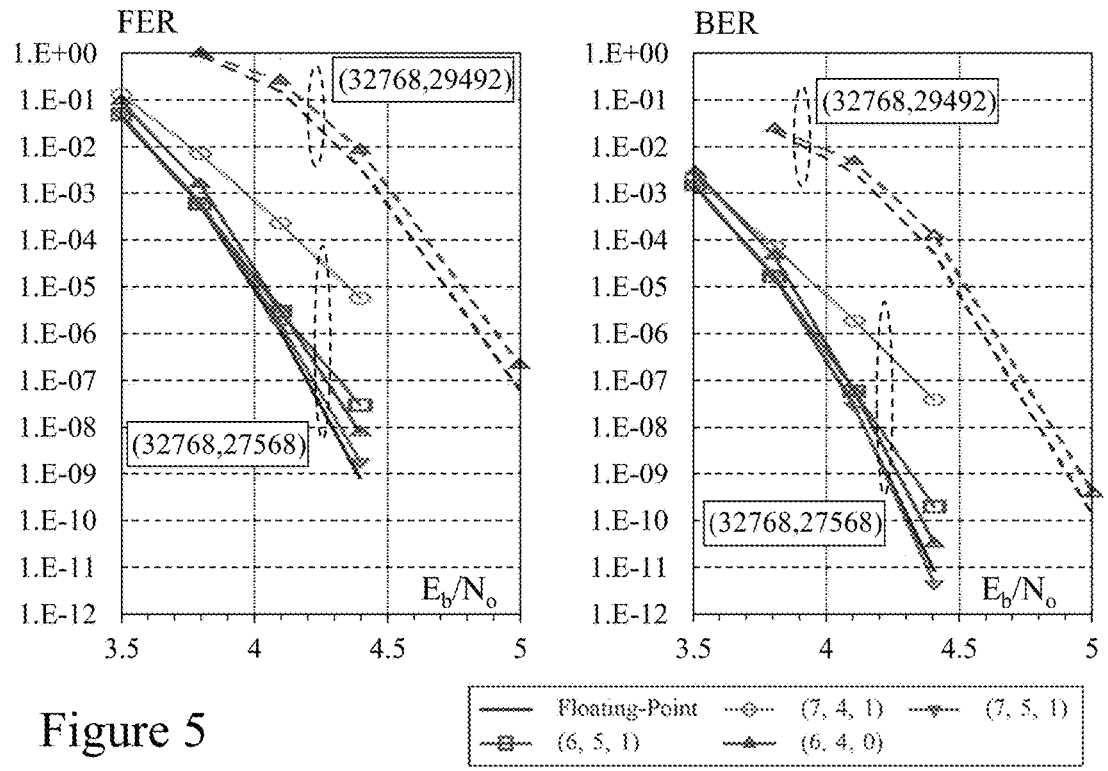
FIG. 5 depicts the effect of quantization on the error-correction performance of the (32768, 27568) and (32768, 29492) codes.

Now referring to FIG. 5 shows the effect of quantization on the (32768, 27568) polar code that was constructed for $E_b/N_0$=4.5 dB. The quantization numbers are presented in (W, $W_C$, F) format, where W is total number of quantization bits for internal LLRs, $W_C$ for channel LLRs, and F is the number of fractional bits. As the inventive algorithm does not perform any operations that increase the number of fractional bits, only the integer ones, the inventors use the same number of fractional bits for both internal and channel LLRs.

From the FIG. 5, it can be observed that using a (7, 5, 1) quantization scheme yields performance extremely close to that of the floating-point decoder. Decreasing the range of the channel values to three bits by using the (7, 4, 1) scheme significantly degrades performance. While completely removing fractional bits, (6, 4, 0), yields performance that remains within 0.1 dB of the floating-point decoder throughout the entire $E_b/N_0$ range. This indicates that the decoder needs four bits of range for the channel LLRs. Keeping the channel LLR quantization the same, but reducing the range of the internal LLRs by one bit and using (6, 5, 1) quantization does not affect the error-correction performance for $E_b/N_0 < 4.25$ dB. After that point however, the performance starts to diverge from that of the floating-point decoder. Therefore, the range of internal LLR values increases in importance as $E_b/N_0$ increases. Similarly, using (6, 4, 0) quantization proved sufficient for decoding the (32768, 29492) code.

From these results, the inventors conclude that minimum number of integer quantization bits required is six for the internal LLRs and four for the channel ones and that fractional bits have a small effect on the performance of the studied polar codes. The (6, 4, 0) scheme offers lower memory use for a small reduction in performance and would be the recommended scheme for a practical decoder for high-rate codes. Accordingly, for the remainder of Section A the inventors have employed the (6, 4, 0) and (7, 5, 1) schemes to illustrate the performance-complexity tradeoff between them.

A.3.7. Latency Compared to ML-SSC Decoding

The different nodes have varying effects on the latency. Referring to Table A4 there are listed the latencies, in clock cycles, of the ML-SSC decoder without utilizing any of the new node types when decoding a (32768, 29492) code. It then lists the latency of that decoder with the addition of each of the different node types individually, and finally with all of the nodes. Since this is a high rate code, $N^{REP}$ nodes have a small effect on latency. An ML-SSC decoder with $N^{REP\text{-}SPC}$ nodes has 89.7% the latency of the regular ML-SSC decoder, and one with $N^{SPC}$ node has 63.6% the latency. Finally, the inventive decoder with all nodes has 54% the latency of the ML-SSC decoder. From these results, the inventors conclude that $N^{SPC}$ nodes have the largest effect on reducing the latency of decoding this code; however, other nodes also contribute measurably.

TABLE A4

Latency of ML-SSC decoding of the (32768, 29492) code and the effect of using additional nodes types on it.

| None | SPC | REP-SPC | REP | All |
|------|-----|---------|-----|-----|
| 5286 | 3360 | 4742 | 5042 | 2847 |

A.4: Architecture: Top-Level

As discussed above, Table A3 lists the 12 functions performed by the decoder. Deducing which function to perform online would require additional controller logic which whilst this may be implemented within embodiments of the invention has not been to date by the inventors. Accordingly, the decoder is provided with an offline-calculated list of functions to perform. This does not reduce the decoder's flexibility as a new set of functions corresponding to a different code can be loaded at any time. To further simplify implementation, the inventors present the decoder with a list of instructions, with each instruction composed of the function to be executed, and a value indicating whether the function is associated with a right or a left child in the decoder tree. An instruction requires 5 bits to store: 4 bits to encode the operation and 1 bit to indicate child association. For the N=32768 codes employed in describing embodiments of the invention, the maximum instruction memory size was set to 3000×5 bits, which is smaller than the 32768 bits required to directly store a mask of the frozen-bit locations. This list of instructions can be viewed as a program executed by a specialized microprocessor, in this case, the decoder.

Figure 6:
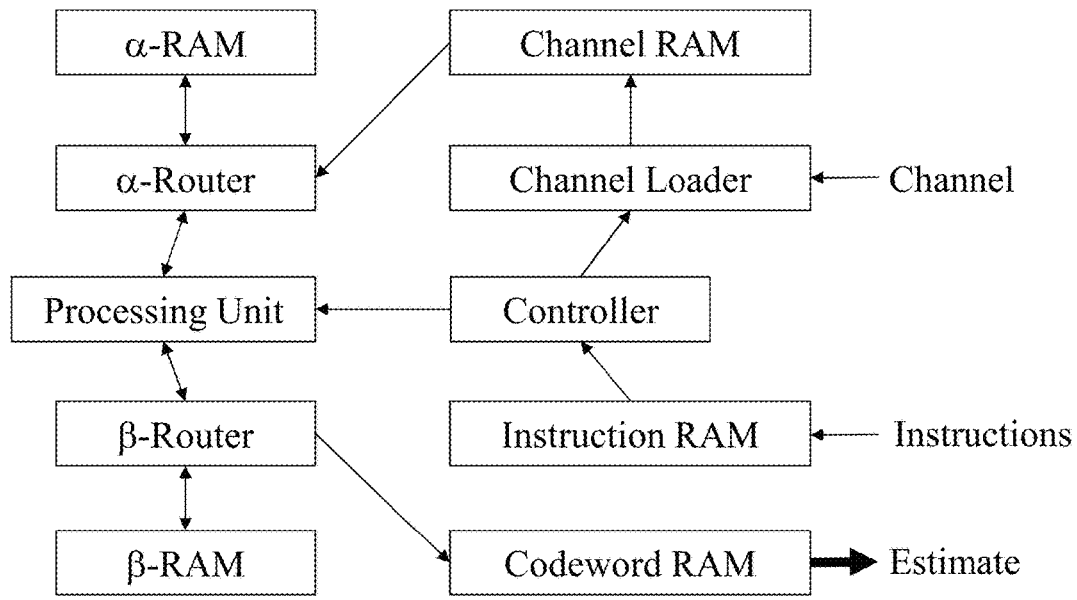
FIG. 6 depicts a top level architecture of the decoder according to an embodiment of the invention.

With such a view, the inventors present the overall architecture of the inventive decoder in FIG. 6. At the beginning, the instructions (program) are loaded into the instruction RAM (instruction memory) and fetched by the controller (instruction decoder). The controller then signals the channel loader to load channel LLRs into memory, and data processing unit (ALU) to perform the correct function. The processing unit accesses data in $\alpha$- and $\beta$-RAMs (data memory). The estimated codeword is buffered into the codeword RAM which is accessible from outside the decoder. By using a pre-compiled list of instructions, the controller is reduced to fetching and decoding instructions, tracking which stage is currently decoded, initiating channel LLR loading, and triggering the processing unit.

It should be noted that the following description presents a complete decoder, including all input and output buffers needed to be flexible. While it is possible to reduce the size of the buffers, this is accompanied by a reduction in flexibility and limits the range of codes which can be decoded at full throughput, especially at high code rates. This tradeoff is explored in more detail subsequently within this specification in Sections A.5.C and A.6.

A.5: Architecture: Data Loading and Routing

When designing the decoder, the inventors elected to include the required input and output buffers in addition to the buffers required to store internal results. To enable data loading while decoding and achieve the maximum throughput supported by the algorithm, $\alpha$ values were divided between two memories: one for channel $\alpha$ values and the other for internal ones as described in Sections A.5.1 and A.5.2 respectively. Similarly, $\beta$ values were divided between two memories as discussed in Sections A.5.3 and A.5.4 respectively whilst routing of data to and from the processing unit is presented in Section A.5.5. As high throughput is the target of this design, the inventors choose to improve timing and reduce routing complexity at the expense of logic and memory use.

A.5.1 Channel $\alpha$ Values

Due to the lengths of polar codes with good error-correction performance, it is not practical to present all the channel output values to the decoder simultaneously. For the proposed design, the inventors have settled to provide the channel output in groups of 32 LLRs; so that for a code of length 32768, 1024 clock cycles are required to load one frame in the channel RAM. Since the codes of rates 0.8413 and 0.9 require 3631 and 2847 clock cycles to decode, respectively, stalling the decoder while a new frame is loaded will reduce throughput by more than 25%. Therefore, loading a new frame while currently decoding another is required to prevent throughput loss.

The method employed in this inventive decoder for loading a new frame while decoding is to use a dual-port RAM that provides enough memory to store two frames. The write port of the memory is used by the channel loader to write the new frame; while the read port is used by the $\alpha$-router to read the current frame. Once decoding of the current frame is finished, the reading and writing locations in the channel RAM are swapped and loading of the new frame begins. This method was selected as it allowed full throughput decoding of both rate 0.8413 and 0.9 codes without the need for a faster second write clock while maintaining a reasonable decoder input bus width of 32×5=160 bits, where five quantization bits are used for the channel values, or 128 bits when using (6, 4, 0) quantization. Additionally, channel data can be written to the decoder at a constant rate by utilizing handshaking signals.

The decoder operates on 2P channel $\alpha$-values simultaneously, requiring access to a 2*256*5=2560-bit read bus. In order for the channel RAM to accommodate such a requirement while keeping the input bus width within practical limits, it must provide differently sized read and write buses. One approach is to use a very wide RAM and utilize a write mask; however, such wide memories are discouraged from an implementation perspective. Instead, multiple RAM banks, each has the same width as that of the input bus, are used. Data is written to one bank at a time, but read from all simultaneously. The proposed decoder utilizes 2*256/32=16 banks each with a depth of 128 and a width of 32*5=160 bits. This memory cannot be merged with the one for the internal α values without stalling the decoder to load the new frame as the latter's two ports can be used by the decoder simultaneously and will not be available for another write operation.

Another method for loading-while-decoding is to replace the channel values once they are no longer required. This occurs after 2515 and 2119 clock cycles, permitting the decoder 1116 and 728 clock cycles in which to load the new frame for the R=0.8413 and R=0.9 codes, respectively. Given these timing constraints, the decoder is provided sufficient time to decode the rate 0.8413 code, but not the rate 0.9 one, at full throughput. To decode the latter, either the input bus width must be increased, which might not be possible given design constraints, or a second clock, operating faster than the decoder's, must be utilized for the loading operation. This approach sacrifices the flexibility of decoding very high-rate codes for a reduction in the channel RAM size. The impact of this compromise on implementation complexity is discussed in Section A.6.

A.5.2. Internal α Values

The $f$ and g functions are the only two components of the decoder that generate α values as output: each function accepts two α values as inputs and produces one. Since up to P such functions are employed simultaneously, the decoder must be capable of providing 2P α values and of writing P values. To support such a requirement, the internal α value RAM, denoted α-RAM, is composed of two P-LLR wide memories. A read operation provides data from both memories; while a write operation only updates one. Smaller decoder stages, which require fewer than 2P α values, are still assigned a complete memory word in each memory. This is performed to reduce routing and multiplexing complexity. Each memory can be composed of multiple RAM banks as supported by the implementation technology.

Since read from and write to α-RAM operations can be performed simultaneously, it is possible to request a read operation from the same location that is being written. In this case, the memory must provide the most recent data. To provide this functionality for synchronous RAM, a register is used to buffer newly written data and to provide it when the read and write addresses are the same.

A.5.3. Internal β Values

The memory used to store internal β values needs to offer greater flexibility than α-RAM, as some functions, such as COMBINE, generate 2P bits of β values while others, such as ML and REP, generate P or fewer bits.

The β-RAM organized as two dual-port memories that are 2P bits wide each. One memory stores the output of left children while the other that of right ones. When a read operation is requested, data from both memories is read and either the lower or the upper half from each memories is selected according to whether the read address is even or odd. Similar to the α memories, the β memories can be composed of multiple banks each. Since β-RAM is read from and written to simultaneously, using the second port of a narrower dual-port RAM and writing to two consecutive addresses to improve memory utilization is not possible as it would interfere with the read operation and reduce throughput.

A.5.4. Estimated Codeword

The estimated codeword is generated 2P=512 bits at a time. These estimated bits are stored in the codeword RAM in order to enable the decoder to use a bus narrower than 512 bits to convey its estimate and to start decoding the following frame immediately after finishing the current. In addition, buffering the output allows the estimate to be read at a constant rate. The codeword RAM is a simple dual-port RAM with a 2P=512-bit write bus and a 256-bit read bus and is organized as N/2P=64 words of 512 bits. Similar to the case of α value storage, this memory must remain separate from the internal β memory in order to support decoding at full speed; otherwise, decoding must be stalled while the estimated codeword is read due to lack of available ports in RAM.

A.5.5. Routing

Since both α and β values are divided between two memories, some logic is required to determine which memory to access, which is provided by the α- and β-routers. The α-router receives stage and word indices, determines whether to fetch data from the channel or α-RAM, and calculates the read address. Only α-RAM is accessible for write operations through the α-router. Similarly, the β-router calculates addresses and determines which memory is written to; and read operations are only performed for the β-RAM by the β-router.

A.6: Architecture: Data Processing

A mentioned in Section A.3, the inventive algorithm requires many decoder functions, which translate into instructions that in turn are implemented by specialized hardware blocks. Now referring to FIG. 7 there is illustrated the architecture of the data processing unit, α, $β_0$, and $β_1$ are the data inputs; while α', $β_0$', and $β_1$' are the corresponding outputs. The first multiplexer ($m_0$) selects either the $β_0$ value loaded from memory or the all-zero vector, depending on which opcode is being executed. Another multiplexer ($m_1$) selects the result of $f$ or g as the α output of the current stage. Similarly, one multiplexer ($m_2$) chooses which function provides the $β_0$ output. Finally, the last multiplexer ($m_3$) selects the input to the COMBINE function.

The critical path of the design passes through g, SPC, and COMBINE; therefore, these three blocks must be made fast. As a result, the merged processing element (PE) of the inventors employed in their semi-parallel successive cancellation decoders, whilst a potential embodiment, is not employed as it has a greater propagation delay than one implementing only g. Similarly, using two's complement arithmetic, instead of sign-and-magnitude, results in a faster implementation of the g function as it performs signed addition and subtraction.

Within the following sections the architecture of the different blocks is described along with design decisions although the inventors omit the sign block from the detailed description since it simply selects the most significant bit of its input to implement.

A.6.1. The $f$ and g Blocks

As mentioned supra, due to timing constraints, $f$ and g are implemented separately and use the two's complement representation. The $f$ block contains P $f$ elements which calculate their output by directly implementing Equations (2B) and (2C). To simplify the comparison logic, the inventors limit the most negative number to $-2^Q+1$ instead of $-2^Q$ so that the magnitude of an LLR contains only Q−1 bits. The g element also directly implements Equation (3B) with saturation to $2^Q-1$ and $-2^Q+1$. This reduction in range did not affect the error-correction performance in simulations performed by the inventors. The combined resource utilization of an $f$ element and a g element is slightly more than that of the merged PE previously exploited by the inventors; however the g element is approximately 50% faster.

Using two's complement arithmetic negatively affected the speed of the $f$ element. This, however, does not impact the overall clock frequency of the decoder since the path in which $f$ is located is short. Since bit-reversal is used, $f$ and g operate on adjacent values in the input α and the outputs are correctly located in the output α for all constituent code lengths. Special multiplexing rules would need to be added to support a non-bit-reversed implementation, increasing complexity without any positive effects.

A.6.2. Repetition Block

The repetition block, described in Section A.3.2 and denoted REP in FIG. 7, also benefits from using two's complement as its main component is an adder tree that accumulates the input, the sign of whose output is repeated to yield the β value. As can be seen in Table A2, the largest constituent repetition code in the polar codes of interest is of length 16. Therefore, the adder tree is arranged into four levels. Since only the sign of the sum is used, the width of the adders was allowed to grow up in the tree to avoid saturation and the associated error correction performance degradation. This tree is implemented using combinational logic.

When decoding a constituent code whose length $N_v$ is smaller than 16, the last $16-N_v$ are replaced with zeros and do not affect the result. An attempt at simplifying logic by using a majority count of the sign of the input values was found by the inventors to cause significant reduction in error-correction performance without being accompanied by a perceptible reduction in the resource utilization of the decoder.

A.6.3. Repetition-SPC Block

This block corresponds to the very common node with $N_v=8$ whose left child is a repetition code and its right an SPC code. The inventors implement this block using two SPC nodes and one repetition node. First, four $f$ processing elements in parallel calculate the $\alpha_{REP}$ vector to be fed to a small repetition decoder block. At the same time, both possible vectors of LLR values, $\alpha_{SPC0}$ and $\alpha_{SPC1}$, one assuming the output of the repetition code is all zeros and the other all ones are calculated using eight g processing elements. Those vectors are fed to the two SPC nodes $SPC_0$ and $SPC_1$.

The outputs of these SPC nodes are connected to a multiplexer. The decision $\beta_{REP}$ from the repetition node is used to select between the outputs of $SPC_0$ and $SPC_1$. Finally, results are combined to form the vector of decoded bits $\beta_v$ out of $\beta_{REP}$ and either $\beta_{SPC0}$ or $\beta_{SPC1}$. This node is also purely combinational.

A.6.4. Single-Parity-Check Block

Due to the large range of constituent code lengths [4, 8192] that it must decode, the SPC block is the most complex in the decoder. At its core, is a compare-select (CS) tree to find the index of the least reliable input bit as described in Section A.3.1. While some small constituent codes can be decoded within a clock cycle; obtaining the input of larger codes requires multiple clock cycles. Therefore, a pipelined design with the ability to select an output from different pipeline stages is required. The depth of this pipeline is selected to optimize the overall decoding throughput by balancing the length of the critical path and the latency of the pipeline. Table A1 was used as the guideline for the pipeline design.

As codes with $N_v \in (0,8]$ are the most common, their output is provided within the same clock-cycle. Using this method, pipeline registers were inserted in the CS tree so that there was a one clock cycle delay for $N_v \in (8,64]$ and two for $N_v \in (64,256]$. Since, in the tested codes, SPC nodes only exist in a P-RSPC or a P-0SPC configuration and they receive their input from the g elements, their maximum input size is P, not 2P. Therefore, any constituent SPC code with $N_v > P$ receives its input in multiple clock cycles. The final stage of the pipeline handles this case by comparing the results from the current input word with that of the previous one, and updating a register as required. Therefore, for such cases, the SPC output is ready in $(N_v/P)+4$ clock cycles. The extra clock cycle improved operating frequency and the overall throughput. The pipeline for the parity values utilizes the same structure.

A.6.5. Maximum-Likelihood Block

When implementing a length 16 exhaustive-search ML decoder the inventors noted that it formed the critical path and was significantly slower than the other blocks. In addition, once repetition, SPC, and repetition-SPC decoders were introduced, the number of ML nodes of length greater than four became minor. Therefore, the ML node was limited to constituent codes of length four. When enumerating these codes in the targeted polar codes, the inventors noticed that the one with a generator matrix G=[0001;1000] was the only such code to be decoded with an ML node. The other length-four constituent codes were the rate zero, rate one, repetition, and SPC codes; other patterns never appeared. Thus, instead of implementing a generic ML node that supports all possible constituent codes of length four, only the one corresponding to G=[0001;1000] is realized. This significantly reduces the implementation complexity of this node.

The ML decoder finds the most likely codeword among the $2^{k_v}=4$ possibilities. As only one constituent code is supported, the possible codewords are known in advance. Four adder trees of depth two calculate the reliability of each potential codeword, feeding their result into a comparator tree also of depth two. The comparison result determines which of [0000], [0001], [0101] or [0100] is the most likely codeword. This block is implemented using combinational logic only.

A.7: Implementation Results

A.7.1. Methodology

The inventive decoder was validated by the inventors against a bit accurate software implementation, using both functional and gate-level simulations. Random test vectors were used. The bit-accurate software implementation was used to estimate the error correction performance of the decoder and to determine acceptable quantization levels.

Logic synthesis, technology mapping, and place and route were performed to target two different FPGAs. The first being an Altera Stratix IV EP4SGX530KH40C2 and the second an Xilinx Virtex VI XC6VLX550TL-1LFF1759. These were chosen to provide a fair comparison with state of the art decoders within the literature. In both cases, the inventors used the tools provided by the vendors, Altera Quartus II 13.0 and Xilinx ISE 13.4. Moreover, the inventors used worst case timing estimates e.g. the maximum frequency reported for the FPGA from Altera Quartus is taken from the results of the "slow 900 mV 85° C." timing model.

A.7.2. Comparison with the State of the Art SC- and SSC-Based Polar Decoders

The fastest SC-based polar decoder in literature known by the inventors was implemented as an application-an application-specific integrated-circuit (ASIC) for a (1024, 512) polar code. Since our goal is in better performing longer codes, the inventors compare the proposed decoder with the FPGA-based, length 32768 implementation of a semi-parallel successive-cancellation (SP-SC) decoder by the inventors. Results for the same FPGA are shown in Tables A5 and A6 respectively. For a (32768, 27568) code, the inventive decoder is 15 to 29 times faster than the SP-SC decoder of the inventors. For the code with a rate of 0.9, it has 19 to 40 times the throughput of SP-SC depending on P and the quantization scheme used, and achieves an information throughput of 1 Gbps for both quantization schemes. It can be also noted that the proposed decoder uses significantly fewer LUTs and registers but requires more RAM, and can be clocked faster. If the decoder followed the buffering scheme of the inventors within their SP-SC decoder, namely, one input frame and no output buffering, its RAM usage would decrease to 507,248 bits for the P=256, (7, 5, 1) case and to 410,960 bits when P=64 and the (6, 4, 0) quantization scheme is used.

TABLE A5

Post-fitting results for a code of length 32768 on the Altera Stratix IV EP4SGX530KH40C2.

| Algorithm | P | Q | LUTs | Registers | RAM (bits) | f (MHz) |
|---|---|---|---|---|---|---|
| SP-SC (inventors) | 64 | 5 | 58,480 | 33,451 | 364,288 | 66 |
| Embodiment of Invention | 64 | (6, 4, 0) | 6,830 | 1,388 | 571,800 | 108 |
| | | (7, 5, 1) | 8,234 | 858 | 675,864 | 100 |
| | 256 | (6, 4, 0) | 25,866 | 7,209 | 536,136 | 108 |
| | | (7, 5, 1) | 30,051 | 3,692 | 700,892 | 104 |

TABLE A6

Information throughput comparison for codes of length 32768 on the Altera Stratix IV EP4SGX530KH40C2.

| Algorithm | Code Rate | P | Q | T/P (Mbps) |
|---|---|---|---|---|
| SP-SC (inventors) | 0.84 | 64 | 5 | 26 |
| | 0.90 | 64 | 5 | 28 |
| Embodiment of Invention | 0.84 | 64 | (6, 4, 0) | 425 |
| | | | (7, 5, 1) | 406 |
| | | 256 | (6, 4, 0) | 791 |
| | | | (7, 5, 1) | 775 |
| | 0.90 | 64 | (6, 4, 0) | 547 |
| | | | (7, 5, 1) | 523 |
| | | 256 | (6, 4, 0) | 1,081 |
| | | | (7, 5, 1) | 1,077 |

Although implementation results for P=256 were not published by the inventors for the SP-SC the throughput of the SP-SC algorithm asymptotically approaches $0.5 \cdot f_{CLK} \cdot R$ where $f_{CLK}$ is the clock frequency. Therefore, even when running at its maximum possible throughput, SP-SC remains 16 to 34 times slower than the proposed inventive decoder for the (32768, 29492) code. The results for the rate 0.9 code with P=256 and the (7, 5, 1) quantization scheme were obtained using Synopsis Synplify Premier F-2011.09-SP1-1 and Altera Quartus 11.1.

The comparisons with the two-phase successive-cancellation (TPSC) decoder are for a prior art design which comprises an SC-based decoder that optimizes the algorithm to reduce memory and employs elements of SSC decoding to improve throughput. It is limited to values of N that are even powers of two. Therefore, in Table A7 the inventor utilize a (16384, 14746) code constructed for $E_b/N_0$=5 dB and compare the resulting resource utilization and information throughput with published results. The quantization schemes used were (6, 4, 0) for the proposed decoder and 5 bits for TPSC. Since the prior art does not include the input buffers necessary to sustain the presented throughput, Table A7 provides an extra entry, denoted TPSC*, that includes the added RAM required to buffer a second input frame. From Table A7, it can be seen that the proposed algorithm is eight times faster than TPSC even though the latter is running at more than twice the frequency. Additionally the proposed algorithm uses 1.7 times the LUTs and 1.2 times the registers of TPSC. When both decoder include buffers to store two received frames, the proposed algorithm uses 1.4 times the RAM of TPSC. Based on this comparison, it can be concluded that TPSC cannot match the throughput of the proposed algorithm according to embodiments of the invention with the same complexity by utilizing multiple decoders decoding different frames simultaneously since the resulting TPSC system will utilize more than four times the resources of the proposed decoder. The last entry in the table presents the results achievable by the proposed decoder with P=256, where the information throughput is ~1.1 Gbps.

TABLE A7

Post-fitting and information throughput results for a (16384, 14746) code on the Altera Stratix IV EP4SGX530KH40C2.

| Algorithm | P | LUTs | Registers | RAM (bits) | f (MHz) | T/P (Mbps) |
|---|---|---|---|---|---|---|
| TPSC | 128 | 7,815 | 3,006 | 114,560 | 230 | 106 |
| TPSC* | 128 | 7,815 | 3,006 | 196,480 | 230 | 106 |
| Embodiment of Invention | 128 | 13,388 | 3,688 | 273,740 | 106 | 824 |
| | 256 | 25,219 | 6,529 | 285,336 | 106 | 1,091 |

A.7.3. Comparison with LDPC Code of Similar Error Correcting Performance

Within the prior art a fully-parallel (2048, 1723) LDPC decoder on FPGA has been reported, operating at 30.7 MHz on a Xilinx Virtex VI XC6VLX550TL, achieving an information throughput of 1.1 Gbps is reached. Early termination could be used to achieve 8.8 Gbps at $E_b/N_0$=5 dB, however that would require support for early termination circuitry and extra buffering that were not implemented within the prior art implementation. In comparison an inventive decoder with P=256 and a (32768, 27568) polar code implemented on the same FPGA as the LDPC decoder provides the performance presented in Table A8. Whilst the decoder according to embodiments of the invention achieves half of the throughput of the LDPC it does so with 5 times fewer LUTs.

TABLE A8

Comparison with an LDPC code of similar error correcting performance, on the Xilinx Virtex VI XC6VLX550TL

| Code | Q | LUTs | $f_{MAX}$ (MHz) | T/P (Gbps) |
|---|---|---|---|---|
| LDPC Prior Art | 4 | 99,468 | 30.7 | 1.102 |
| Embodiment of Invention | (6, 4, 0) | 18,024 | 71.3 | 0.542 |
| | (7, 5, 1) | 21,700 | 71.0 | 0.539 |

A.8: Summary

Within the preceding sections the inventors have presented a new novel algorithm for decoding polar codes which results in a high-throughput, flexible decoder. FPGA implementations of the proposed algorithm are able to achieve an information throughput of 1 Gbps when decoding a (32768, 29492) polar code with a clock frequency of 108 MHz. Extensions to application specific integrated circuit (ASIC) implementations could provide derivative decoders implementing the inventive algorithm at a throughput of 3 Gbps when operating at 300 MHz with a complexity lower than that required by LDPC decoders of similar error correction performance. Accordingly, embodiments of the invention may be exploited in power sensitive, high throughput applications such as exist within data storage systems, for example.

B: Simplified Successive Cancellation for Multiple Candidate Codeword Selection in List Decoders

B.1 List-CRC Decoding

Within the preceding Sections A.1.1 to A.1.3 polar codes and successive cancellation decoders were presented and reviewed. However, instead of selecting one value for an estimate as given by Equations (1) through (2C), a list decoder works by assuming both 0 and 1 are estimates of the bit $u_i$ and generates two paths which are decoded using SC decoding. Without a set limit, the number of paths doubles for every information bit, growing exponentially and thus becoming a maximum-likelihood (ML) decoder. To constrain this complexity, a maximum of L distinct paths, the most likely ones, are kept at the end of every step. Thus, a list decoder presents the L most likely codeword candidates after it has estimated all bits. The codeword among the L with the best path reliability metric, i.e. the largest likelihood value, is chosen to be the decoder output.

However, when a polar list decoder fails, the correct codeword is often among the L final candidates. Accordingly, within the prior art it was proposed that a cyclic redundancy check (CRC) with the information bits would provide a means to address this with commensurately increasing the rate of the polar code to accommodate the additional bits and maintain the overall system rate. The CRC provides the criterion for selection from among the candidate, final codewords. The likelihood of the codewords is only consulted either when two or more candidates satisfy the CRC constraint or when none do. The resulting list-CRC decoder offers a significant improvement in error-correction performance over regular list decoding, to the extent that polar codes employing list-CRC decoding have been shown within the were shown to be able to outperform turbo codes and LDPC codes of similar lengths and rates.

However, list-SC decoding, like SC decoding, remains a sequential process. Moreover, L paths must now be decoded instead of one, increasing the latency from O(N log N) to O(L·N log N) and decreasing throughput by the same factor. In order to address decoder throughput, adaptive list decoding has been presented within the prior art which starts with L=1 and restarts with L=2 if the CRC is not satisfied. The list size is subsequently doubled until the constraint is satisfied or a maximum size, $L_{MAX}$, is reached, in which case the candidate with the highest reliability is selected. However, this method significantly increases latency, which becomes that given by Equation (9) where A–SC–List($L_{MAX}$) is an adaptive list decoder with a maximum list size of $L_{MAX}$ and SC–List(L) is a list decoder with list size L.

$$L(A - SC - \text{List}(L_{MAX})) = \sum_{l=0}^{log_2 L_{MAX} - 1} L(SC - \text{List}(2^l)) \qquad (9)$$

B.2 SSC-List Decoder

Within Sections A.1. and A.2 SC, SSC and ML-SSC decoding were briefly reviewed and discussed whilst in Section B.1 List decoding is similarly briefly reviewed and discussed. Within the following sections the inventors present a novel SSC-based List decoding algorithm together with discussions on its implementation details wherein Rate-0 nodes are ignored and their soft-input is not calculated by their parent, and rate-R nodes operate as in SC-List decoding. Accordingly, the inventors focus on rate-1 nodes, and show in section B.4.3 that the inventive decoder is six times as fast the SC-List decoder of the prior art. It should be noted that this decoder was implemented using log-likelihoods (LL) to represent bit reliabilities.

B.2.1. Chase-Like Decoding of Rate-1 Nodes

The function of the rate-1 node decoder is to provide a list of the L most reliable candidate codewords given its LL input $\alpha$, where each LL $\alpha[i]$ consists of $\alpha_0[i]$ and $\alpha_1[i]$. For a constituent code of rate 1 and length $N_v$, there exist $2 \cdot N_v$ candidate codewords, rendering an exhaustive search impractical for all but the smallest of such codes. Therefore, the inventors employ the candidate generation method of Chase decoding.

$$\beta[i] = \begin{cases} 0 & \text{when } \alpha_0[i] \geq \alpha_1[i] \\ 1 & \text{otherwise} \end{cases} \qquad (10)$$

$$R_X = \sum_i \alpha_{\beta[i]}[i] \qquad (11)$$

Maximum-likelihood decoding of a rate-1 constituent code is performed on a bit-by-bit basis as given by Equation (10). To provide a list of candidate codewords, the least reliable bits determined using $r[i]=|\alpha_0[i]-\alpha_1[i]|$ of the ML decision are flipped individually. Simulation results by the inventors have also shown that two-bit errors must also be considered. Therefore, the list of candidates is augmented with codewords that differ from the ML decision by two of the least reliable bits. The list of candidates is pruned to include, at most, L candidates. This is accomplished by discarding the least reliable candidates, where the reliability of a path x with an estimated output $\beta$ is calculated according to Equation (11).

B. 2.2 Implementation of Rate-1 Decoders

The rate-1 decoder starts by initializing its set of candidates to an empty set. Then, for each source path p, it will calculate and store the ML decision and generate a set of candidate forks. Once the decoder has iterated over all source paths, it will store the up to L most reliable paths from the ML decisions and the candidate forks, discarding the rest. The top-level function corresponds to Algorithm 1 which shows how the bit reliabilities r and the path reliability R are calculated in tandem with the ML decision. The candidate forks are appended to the candidate set when there are fewer than L candidates already stored; otherwise, they replace other candidates with lower reliability.

Algorithm 1: Decode Rate 1 Code

```
1:  candidates = { }
2:  for p ∈ sourcePaths do
3:     R_p = 0
4:     for i = 0 to N_v - 1 do
5:        β^p[i] = arg max_x (α_x^p[i])
6:        r[i] = |α_0^p[i] - α_1^p[i]|
7:        R_p = R_p + max(α_0^p[i], α_1^p[i])
8:     end for
9:     store(p, R_p)
10:    if candidates.count < L then
11:       append Candidates(candidates)
12:    else
13:       replace Candidates(candidates)
14:    end if
15: end for
16: merge BestCandidates(candidates)
```

In contrast Algorithm 2, shows how candidates are appended to the set. Empirically, it was observed that not all bits need to be considered when enumerating potential single-bit errors, limiting the search to the c least reliable bits was sufficient, as in Chase decoding. Therefore, this method performs a partial sort to find those bits. The candidates are generated by flipping those bits individually, and their reliabilities are calculated according to Equations (12A) and (12B). Since a candidate might be later discarded if it is not among the L most reliable paths, it is important for speed reasons to minimize the amount of information stored about each candidate. Therefore only the information needed to construct a new path is stored in the candidate set: the source path p, the path reliability $R_i$, and the location of bits in which it differs from the source path bitsToFlip. Candidates with two-bit errors are generated in a similar manner by iterating over all unique pairs of bits among the c least reliable ones. To remove conditionals from the inner loops in this algorithm, the set of candidates is allowed to contain more than L candidates. Selecting the correct number of candidates to store as new paths, is performed at a later point by the rate-1 decoder.

$$R_i = R_p - r[i] = R_p - |\alpha_o^p[i] - \alpha_1^p[i]| \quad (12A)$$
$$= R_p - \max(\alpha_o^p[i], \alpha_1^p[i]) + \min(\alpha_o^p[i], \alpha_1^p[i]) \quad (12B)$$

---

Algorithm 2: appendCandidates

---

1: //Appends forks of path p to candidates with constraint c
2: partialSort(r, c)
3: for i = 0 to c − 1 do //Single-bit errors
4:     $R_i = R_p - r[i]$
5:     bitsToFlip = {bitIndex[i]}
6:     candidates.insert(p, $R_i$, bitsToFlip)
7: end for
8: for i = 0 to c − 2 do //Two-bit errors
9:     for j = i + 1 to c − 1 do
10:         $R_{ij} = R_p - r[i] - r[j]$
11:         bitsToFlip = {bitIndex[i], bitIndex[j]}
12:         candidates.insert(p, $R_{ij}$, bitsToFlip)
13:     end for
14: end for

---

When the set of candidates already contains L or more candidates, the decoder will only replace an existing candidate with a new one when the latter is more reliable. Algorithm 3 describes this process wherein it iterates over candidates with single-bit and two-bit errors and adds them to the set of candidates if their reliability is greater than the minimum stored in the set. Every time a new candidate is added to the set, the least reliable one is removed. This prevents the set of candidates from storing a large number of candidates that will be discarded later. Similar to Algorithm 2, it was observed by the inventors via simulations that using a constraint c to limit the candidate search space did not noticeably affect error-correction performance while doubling the decoding speed. Once the candidates for all sources paths have been generated, the most reliable L of them are considered for use as paths replacing less reliable ML decisions of other paths if necessary. This is performed by the mergeBestCandidates( ) method where the new paths have their β value stored by copying and modifying the ML decision of their source path.

---

Algorithm 3: replaceCandidates

---

1: //Replaces the least reliable candidates with more reliable forks of path p .
2: partialSort(r, c)
3: for i = 0 to c − 1 do //Single-bit errors
4:     $R_i = R_p - r[i]$
5:     If $R_i$ > min(candidates.reliability) then
6:         bitsToFlip = {bitIndex(i)}
7:         candidates.insert(p, $R_i$, bitsToFlip)
8:         candidates.remove(candidates.leastReliable)
9:     end if
10: end for
11: for i = 0 to c − 2 do //Two-bit errors
12:     for j = i + 1 to c − 1 do
13:         $R_{ij} = R_p - r[i] - r[j]$
14:         If $R_{ij}$ > min(candidates.reliability) then
15:             bitsToFlip = {bitIndex(i), bitIndex(j)}
16:             candidates.insert(p, $R_{ij}$, bitsToFlip)
17:             candidates.remove(candidates.leastReliable)
18:         end if
19:     end for
20: end for

---

In Algorithms 2 and 3, it is observed that the most common operations performed on the set of candidates, denoted candidates, are insertion, deletion, and finding the minimum. Red-Black trees are well suited for implementing such a data structure since all these operations are performed in $O(\log_2 N_v)$ time in the worst case. In addition, mergeBestCandidates( ) requires that the most reliable candidates be indicated and red-black trees store their contents sorted by key.

B.3: Adaptive SSC-List-CRC Decoder

List decoders have a high latency and a low throughput that are constant regardless of the channel condition. Based on the observation that at high $E_b/N_0$ values the average list size L required to successfully correct a frame is low, an adaptive SC-List-CRC decoder is proposed by the inventors. Within the preceding section the inventors introduced an SSC-List decoding algorithm that has a lower latency and greater throughput than the prior art SC-List decoding algorithm. Despite the improvement, the throughput of that decoder is still significantly lower than a Fast-SSC decoder. Accordingly, the inventors thus propose using an adaptive SSC-List-CRC decoding algorithm that performs the following sequence:

1) Decode a frame using the Fast-SSC algorithm.

2) Verify the validity of the estimated codeword by calculating its CRC.

3) Stop the decoding process if the CRC is satisfied, otherwise move to the next step.

4) Relaunch the decoding process using the SSC-List algorithm and generate a list of L candidate codewords sorted by their path reliability metric.

5) Pick the most reliable candidate among the list generated above that satisfies the CRC.

6) If none of the L candidates satisfy the CRC, pick the codeword with the best path reliability metric.

The difference between this inventive algorithm and that of the prior art is that in order to reduce latency, the list size is not increased gradually. Instead, it is changed from L=1, i.e. using the Fast-SSC decoder, to L=$L_{MAX}$. Therefore, the latency (worst case) is given by Equations (13A) and (13B). Since the latency of the single SSC-List decoder using L=$L_{MAX}$ is much greater than that of the Fast-SSC decoder.

$$L(A - SSC - \text{List}(L_{MAX})) = L(SSC - \text{List}(L_{MAX})) + L(\text{Fast} - SSC) \quad (13A)$$

$$\approx L(SSC - \text{List}(L_{MAX})) \quad (13B)$$

$$T = \frac{k}{(1 - FER_F)L(F) + FER_F L(F)} \quad (14)$$

Let $L(L)=L(SSC-\text{List}(L_{MAX}))$ and $L(F)=L(\text{Fast-SSC})$ and denote the frame-error rate (FER) at the output of the Fast-SSC decoder $FER_F$. The expression for the information throughput (on average) of the proposed adaptive SSC-List decoder when decoding a code with dimension k is given by Equation (14) where it can be observed that for sufficiently low $FER_F$ value, the throughput will determined mostly by the speed of the Fast-SSC decoder.

B.4: Simulation Results

B.4.1. Methodology

All error-correction performance results presented below obtained for the binary-input additive white Gaussian noise (AWGN) channel with random codewords and binary phase-shift keying (BPSK) modulation. Polar codes were constructed and systematic encoding was used. The throughput and latency values were measured on an Intel Core-i7 2600 running at 3.4 GHz. Finally, the rate of the polar code is adjusted to maintain the same overall system rate. For example, when comparing a list-CRC decoder with the (2048, 1723) LDPC decoder and a 32-bit CRC is utilized, the polar code used is PC(2048, 1755) and the overall system rate remains 1723/2048.

B.4.2. Choosing Suitable CRC Length

As discussed supra a CRC serves as better criterion for selecting the correct codeword from the final L candidates even when its likelihood is not the largest. The length of the chosen CRC has an impact on the error-rate that varies with $E_b/N_0$. FIG. 8 depicts the error-correction performance of a (1024, 860) system consisting of polar code concatenated with a CRC of length 8 or 32 and decoded with a list-CRC decoder with list size L=128. It shows that a polar code concatenated with the shorter CRC will perform better at lower $E_b/N_0$ values but will eventually achieve higher error-rates than the polar code concatenated with the longer CRC. Therefore, the length of the CRC can be chosen to improve error-correction performance in the targeted $E_b/N_0$ or BER/FER range.

B.4.3. Error-Correction Performance

It is known that concatenating CRC improves the error correction performance of polar list decoders. Within this section, the inventors first show that the error-correction performance of the proposed SSC-List-CRC decoder is the same as that of the SC-List-CRC decoder in FIG. 9. The inventors then demonstrate that the benefits for longer codes are still significant. As depicted in FIG. 10, for a (32768, 29492) polar code, the use of the proposed algorithm results in a coding gain greater than 0.3 dB and 0.5 dB at a FER of $10^{-5}$ over the Fast-SSC algorithm for L=4 and L=32, respectively. It can be seen that the curves are diverging as $E_b/N_0$ is increasing, and thus the coding gain is growing as well.

B.4.4. Comparison with the SC-List-CRC Decoder

List decoders have latency and throughput that are constant across $E_b/N_0$ values. Referring to Table B1 the values for the SC-List-CRC and SSC-List-CRC decoders for two different list sizes when decoding a (2048, 1723) polar+ CRC-32 code are presented. At L=32, the SSC-based decoder is approximately 7 times as fast the SC-based one. At L=128, it is 6 times as fast.

TABLE B1

Latency and information throughput comparison for list-based decoders using a (2048, 1723) polar + CRC code

| Decoder | L | Latency (ms) | T (kbps) |
|---|---|---|---|
| SC-List-CRC | 32 | 23 | 74 |
| SSC-List-CRC | | 3.3 | 522 |
| SC-List-CRC | 128 | 97 | 17 |
| SSC-List-CRC | | 16 | 107 |

B.4.5. Comparison with LDPC Codes

To the best of the inventors knowledge, the fastest CPU-based LDPC decoder within the prior art for a (1024, 512) LDPC running on two CPU cores was 345 kbps with a fixed number of iterations. The information throughput of a scaled-min-sum decoder the inventors have developed was 555 kbps when running with the same number of iterations but on a single CPU core of similar speed. Therefore, the inventors exploit their LDPC decoder for throughput comparison in this work and enable early termination to further improve its throughput.

A polar list-CRC decoder with a 32-bit CRC and L=32 is within 0.1 dB of the error-correction performance of the 10 GBASE-T (802.3an) LDPC code with identical code length and dimension (2048, 1723) as shown in FIG. 11. When the list size is increased to 64, the polar list-CRC and the LDPC decoders have similar performance. In these simulations the LDPC decoder was using the scaled-min-sum algorithm with a maximum of 30 iterations ($I_{MAX}=30$) and a scaling factor of 0.5.

Table B2 depicts the throughput values for the inventive adaptive SSC-List-CRC decoder with L=64 compared with that of our offset-min-sum LDPC decoder with $I_{MAX}=30$ and an adaptive SC-List-CRC decoder at different $E_b/N_0$ values when decoding (2048, 1723) codes. The inventors first observe that throughput of the decoders improves as $E_b/N_0$ increases since they employ early termination methods: syndrome checking for the LDPC decoder and CRC checking for the adaptive SSC-List one. The LDPC decoder is faster than the proposed decoder at $E_b/N_0=3.5$ dB. At 4.0 dB and 4.5 dB however, the adaptive SSC-List decoder becomes 1.3 and 16 times as fast as the LDPC one, respectively. The latency is 5.5 ms and 7.1 ms for the LDPC and adaptive SSC-List decoders, respectively. Table B2 also shows the throughput of the adaptive SSC-List decoder with L=32, which at 3.5 dB runs at 87% the speed of the LDPC decoder and is 2.7 and 24 times as fast at 4.0 dB and 4.5 dB, respectively. The latency of this decoder is 3.3 ms and, as mentioned in this section, its error-correction performance is within 0.1 dB of the LDPC decoder.

TABLE B2

Information throughput in Mbps for inventive decoder compared to a prior art LPDC decoder at different $E_b/N_0$

| | T (Mbps) | | |
|---|---|---|---|
| Decoder | 3.5 dB | 4.0 dB | 4.5 dB |
| LDPC | 1.04 | 1.81 | 2.25 |
| A. SSC-List-CRC (L = 64) | 0.42 | 2.32 | 36.6 |
| A. SSC-List-CRC (L = 32) | 0.91 | 4.90 | 54.0 |

B5: Summary

Within this section the inventors have presented an inventive novel polar list decoding algorithm whose software implementation is at least 6 times as fast as the original list decoder of the prior art. The inventors have also shown an adaptive decoder which significantly increased the throughput to the point where its throughput is up to 16 times that of an LDPC decoder of the same length, rate, and similar error-correction performance. The inventors believe that such improvements in speed, combined with the error-correction performance, make the adaptive SSC-List decoder a viable option for use as a decoder in software defined radio and other applications. Further, the inventors note that the list decoder may be switched to log-likelihood ratios in order to further reduce latency.

C: Flexible and Low-Complexity Encoding and Decoding of Systemic Polar Codes

C.1: Background

The inventors start by defining what the inventors mean by a "systematic encoder", with respect to a general linear code. For integers $0 < k \leq n$, let $G = G_{k \times n}$ denote a k×n binary matrix with rank k. The notation G being used to denote a generator matrix. Accordingly, the code under consideration is defined by Equation (15A). Accordingly, an encoder, given by Equation (15B) provides a one-to-one function mapping of an information bit vector u, given by Equation (15C), to a codeword x, given by Equation (15D).

$$\text{span}(G) = \{v \cdot G | v \in GF(2)^k\} \quad (15A)$$

$$E: GF(2)^k \to \text{span}(G) \quad (15B)$$

$$u = (u_0, u_1, u_2, \ldots, u_{k-1}) \in GF(2)^k \quad (15C)$$

$$x = (x_0, x_1, x_2, \ldots, x_{n-1}) \in \text{span}(G) \quad (15D)$$

$$S = \{s(j)\}_{j=0}^{k-1}, 0 \leq s_0 < s_1 < \ldots < s_{k-1} \leq n-1 \quad (16)$$

All the encoders presented and discussed in Section C are linear encoders. Namely, $E(u) = u \cdot \Pi \cdot G$ where $\Pi = \Pi_{k \times k}$ is an invertible matrix defined over GF(2). The encoder, E, is systematic if there exists a set of k systematic indexes given by Equation (16) such that restricting E(u) to the indexes S yields u. Specifically, position $s_i$ of x must contain $u_i$. The inventors stress that since the $s_i$ are in increasing order in Equation (16), a restriction operation is all that is needed in order to recover u from x. Namely, the restriction need not be followed by a permutation.

Since G has rank k, there exist k linearly independent columns in G. Thus, one might naively take $\Pi$ as the inverse of these columns, take S as the indexes corresponding to these columns, and state that the inventors are done. Of course, the point of prior art models is to show that the calculations involved can be carried out efficiently with respect to the computational model. One such mode is the standard serial model wherein by making use of the recursive structure of polar codes, it is shown that both the operation of multiplying u by $\Pi$ and the operation of multiplying the resulting vector by G can be carried out in time $O(n \cdot \log n)$.

The inventors are interested in the VLSI model wherein it is known that the operation of multiplying by G can be implemented very efficiently and can be made to run very fast. In contrast, prior art algorithms for calculating $u \cdot \Pi$ seem inherently serial such that a computation is carried out on the first half of the codeword. The algorithm waits for the computation to finish, and use the results in order to perform a very similar operation on the second half of the codeword. In fact, since the algorithm is similar to successive-cancellation (SC) decoding, prior art methods used in order to parallelize SC decoding can be used in this setting as well. However, even with these refinements, multiplying by G will still be much simpler and much faster.

The systematic encoding algorithm presented by the inventors, see for example Gross et al. in US Patent Publication 2013/0117344 entitled "Methods and Systems for Decoding Polar Codes", essentially involves multiplying by G twice and setting frozen bits locations to '0' in between. FIG. 12 depicts this process for a non-reversed (8, 5) polar code using $a_i$ and $x_i$ to denote information and parity bits, respectively. This process is different to that presented by Arikan in "Systematic polar coding" (IEEE Comm. Lett., Vol. 15(8), pp. 860-862). Specifically the prior art of Arikan works for any set of frozen indices whereas the systematic prior art encoding by the inventors does not. It was observed by the inventors that a bad set of frozen indices does not occur when constructing polar codes, and this was assumed to always hold. In the following sections the inventors prove that this assumption is indeed true.

C.2: Systematic Encoding of Polar Codes

In this section a proof in respect of the encoders according to embodiments of the invention is presented proving that Equations (27) and (32) hold valid. The proof was established by Ido Tal of Technion—Israel Institute of Technology in Haifa, Israel, in conjunction with Gabi Sarkis and Pascal Giard of McGill University (inventors), wherein these are hereinafter referred to as the "theorists" to differentiate from Warren Gross, Gabi Sarkis and Pascal Giard, the inventors of the embodiments of the invention.

The theorists start recasting the concepts and operation presented in the previous section into matrix terminology. Recalling the definition of S as the set of systematic indices, then Equation (17) defining the restriction matrix $R = R_{n \times k}$ $R_n \to k$ corresponding to S can be written.

$$R = R(R_{i,j})_{i=0; j=0}^{n-1; k-1} \text{ where } R_{i,j} = \begin{cases} 1 & \text{if } i = s_j \\ 0 & \text{otherwise} \end{cases} \quad (17)$$

$$\Pi \cdot G \cdot R = I \quad (18)$$

With this definition at hand, the theorists require that $E(u) \cdot R = u$ or equivalently Equation (18), where I denotes the k×k identity matrix. The inventor's proofs will center on showing that Equation (18) holds. Further, the theorists introduce the two variants of polar codes for which our two encoders are tailored. Essentially, the difference between the two codes is a bit reversal operation. Thus, as a first step, the theorists define the concept of bit reversal. From this point forward, the theorists adopt the shorthand $m \overset{\Delta}{=} \log_2 n$. For an integer $0 \leq i < n$, Equation (19) denotes the binary representation of i. Further, we define $\overleftarrow{i}$ as the integer with reverse binary representation as given by Equation (20).

$$\langle i \rangle_2 = (i_0, i_1, \ldots, i_{m-1}), \text{ where } i = \sum_{j=0}^{m-1} i_j 2^j \text{ and } i_j \in \{0, 1\} \quad (19)$$

$$\langle \overleftarrow{i} \rangle_2 = (i_{m-1}, i_{m-2}, \ldots, i_0), \text{ where } \overleftarrow{i} = \sum_{j=0}^{m-1} i_j 2^{m-1-j} \quad (20)$$

Next we denote the n×n bit reversal matrix as $B_n$ which is a permutation matrix. Specifically, multiplying a matrix from the left (right) by $B_n$ results in a matrix in which row (column) i equals row (column) $\overleftarrow{i}$. In common with the prior art the key concept in the definition of polar codes is the kernel matrix wherein the theorists assume the kernel matrix presented by Arikan in "Channel Polarization: A Method for Constructing Capacity achieving Codes for Symmetric Binary-Input Memoryless Channels" (IEEE Trans. Inf. Theory, Vol. 55(7), pp. 3051-3073). Namely let $$F = \begin{bmatrix} 1 & 0 \\ 1 & 1 \end{bmatrix}$$

and that the m-th Kronecker product of F is denoted $F^{\otimes m}$ and is defined recursively as Equation (21). The theorists denote the generator matrices corresponding to their two code variants as $G_{rv}$ and $G_{nrv}$, where the subscripts denote "reversed" and "non-reversed", respectively. The theorists first discuss $G_{rv}$, which corresponds to the version presented by Arikan in "Channel Polarization: A Method for Constructing Capacity achieving Codes for Symmetric Binary-Input Memoryless Channels."

$$F^{\otimes m} = \begin{bmatrix} F^{\otimes(m-1)} & 0 \\ F^{\otimes(m-1)} & F^{\otimes(m-1)} \end{bmatrix}, \text{ where } F^{\otimes 1} = F \quad (21)$$

The matrix $G_{rv}$ is obtained by selecting a subset of k rows from the n×n matrix $B_n F^{\otimes m}$. Thus, the name "reversed" highlights the fact that a bit reversing operation is applied to the Kronecker product of the kernel matrix. The rows selected correspond to the k "best" synthetic channels, as discussed by Arikan. The theorists denote the set of rows selected, termed the active rows, by Equation (22). As before, the theorists recast Equation (22) in matrix terms and hence define $E=E_{k \times n}$ as given by Equation (23) such that by definition we have Equation (24).

$$A = \{\alpha_j\}_{j=0}^{k-1}, 0 \le \alpha_0 < \alpha_1 < ... < \alpha_{k-1} \le n-1 \quad (22)$$

$$E = (E_{i,j})_{i=0;j=0}^{k-1;n-1}, \text{ where } E_{i,j} = \begin{cases} 1 & \text{if } j = \alpha_i \\ 0 & \text{otherwise} \end{cases} \quad (23)$$

$$G_{rv} = E \cdot B_n \cdot F^{\otimes m} \quad (24)$$

As explained, applying E to the left of $B_n F^{\otimes m}$ results in a subset of rows of $B_n F^{\otimes m}$. However, in our context, it is often more natural to think of E as a matrix which transforms an information vector u of length k into a vector u·E of length n. The vector u·E contains $u_i$ at position $\alpha_i$, for $0 \le i \le k-1$, and 0 in all other positions. Thus, E is termed an expanding matrix. The generator matrix $G_{nrv}$ for the inventor's second polar code variant is defined by Equation (25). According to the prior art of Arikan we know that $B_n F^{\otimes m} = F^{\otimes m} B_n$. Thus $G_{rv}=G_{nrv} \cdot B_n$. Namely, $G_{rv}$ and $G_{nrv}$ span the same code, up to a bit-reversing permutation of indexes. With the above notation at hand, the non-reversing encoder can be succinctly described as Equation (26). Note that multiplying a vector v of length n by $E^T$ results in a vector of length k with entry i equal to entry $\alpha_i$ of v. Put another way, $E^T$ equals the restriction matrix R, if the restriction set S equals the set of active rows A. For the case of $E_{nrv}$, this will indeed be the case. Simply put, $u_i$ will appear at position $\alpha_i$ of the codeword. Thus, for the non-reversed case, our aim is to show that Equation (27) holds.

Showing this will further imply that the corresponding Π in Equation (26) is indeed invertible.

$$G_{nrv} = E \cdot F^{\otimes m} \quad (25)$$

$$E_{nrv}(u) = u \cdot \Pi \cdot G_{nrv} = u \cdot (E \cdot F^{\otimes m} \cdot E^T) \cdot (E \cdot F^{\otimes m}) \quad (26)$$

$$E \cdot F^{\otimes m} \cdot E^T \cdot E \cdot F^{\otimes m} \cdot E^T - I \quad (27)$$

As a first step, the theorists define the set of bit-reversed active rows, A, by applying the bit-reverse operation on each element $\alpha_i$. As before, the theorists order the elements of $\overline{A}$ before, in increasing order and denote $\overline{A}$ by Equation (28). Recalling that the expansion matrix E was defined using A, the theorists now define $\overleftarrow{E} = \overleftarrow{E}_{k \times n}$ according to $\overline{A}$ in exactly the same way leading to Equation (29). Note that E·B and $\overleftarrow{E}$ are the same, up to a permutation of rows (for i fixed, the reverse of $\alpha_i$ does not generally equal $\beta_i$, hence the need for a permutation). Thus from Equation (24), we denote $G_{rv}'$ by Equation (30) as a generator matrix spanning the same code as $G_{rv}$. Analogously to Equation (26), our encoder for the reversed code is given by Equation (31). For the reversed encoder, the set of systematic indices is $\overline{A}$. Accordingly, the theorists aim to prove Equation (32).

$$A\{\beta_j\}_{j=0}^{k-1}, \quad (28)$$
$$0 \le \beta_0 < \beta_1 < ... < \beta_{k-1} \le n-1$$

$$\overleftarrow{E} = (\overleftarrow{E}_{i,j})_{i=0;j=0}^{k-1;n-1}, \quad (29)$$
$$\text{where } \overleftarrow{E}_{i,j} = \begin{cases} 1 & \text{if } j = \beta_i \\ 0 & \text{otherwise} \end{cases}$$

$$G_{rv}' = \overleftarrow{E} \cdot F^{\otimes m} \quad (30)$$

$$E_{rv}(u) = u \cdot \Pi \cdot G_{rv}' = u \cdot \left(\overleftarrow{E} \cdot F^{\otimes m} \cdot (\overleftarrow{E})^T\right) \cdot \left(\overleftarrow{E} \cdot F^{\otimes m}\right) \quad (31)$$

$$\overleftarrow{E} \cdot F^{\otimes m} \cdot (\overleftarrow{E})^T \cdot \overleftarrow{E} \cdot F^{\otimes m} \cdot (\overleftarrow{E})^T - I \quad (32)$$

C.3. Domination Contiguity Implies Involution

A square matrix is called an involution if multiplying the matrix by itself yields the identity matrix. With this terminology at hand, the theorists must prove that both $E \cdot F^{\otimes m} \cdot E^T$ and $\overleftarrow{E} \cdot F^{\otimes m} \cdot (\overleftarrow{E})^T$ are involutions. Interestingly, and in contrast with the original systematic encoder presented within the prior art, the proof of correctness centers on the structure of A. That is, within the original systematic encoder, any set of k active (non-frozen) channels has a corresponding systematic encoder. In contrast, consider as an example the case in which n=4 and A={0,1, 3}. By the theorists definitions then we obtain $$E = \begin{bmatrix} 1000 \\ 0100 \\ 0001 \end{bmatrix}, E^T = \begin{bmatrix} 100 \\ 010 \\ 000 \\ 001 \end{bmatrix},$$

and $$F^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}.$$

Thus $$E \cdot F^{\otimes 2} \cdot E^T = \begin{bmatrix} 1 & 0 & 0 \\ 1 & 1 & 0 \\ 1 & 1 & 1 \end{bmatrix} \text{ and}$$

$$(E \cdot F^{\otimes 2} \cdot E^T) \cdot (E \cdot F^{\otimes 2} \cdot E^T) = \begin{bmatrix} 1 & 0 & 0 \\ 0 & 1 & 0 \\ 1 & 0 & 1 \end{bmatrix}.$$

Note that the rightmost matrix above is not an identity matrix.

A similar calculation shows that $\bar{E} \cdot F^{\otimes 2} \cdot (\bar{E})^T$ is not an involution either. The apparent contradiction to the correctness of the theorists algorithms is rectified by noting that A={0,1,3} cannot correspond to a polar code (as will be formalized below). Specifically, the above A implies that $W^{+-}$ is frozen whilst $W^{--}$ is unfrozen, a case which will never occur as discussed within the prior art. The theorists now characterize the A for which (27) and (32) hold. Recalling our notation for binary representation given in Equation (19). For $0 \le i, j \le n$, denote $\langle i \rangle_2 = (i_0, i_1, \ldots, i_{m-1})$, $\langle j \rangle_2 = (j_0, j_1, \ldots, j_{m-1})$. The theorists define the binary domination relation, denoted $\succeq$, as $i \succeq j$ if for all $0 \le t \le m$, we have $i_t \ge j_t$. Namely $i \succeq j$ if the support of $\langle i \rangle_2$ (the indices t for which $i_t=1$) contains the support of $\langle j \rangle_2$. The theorists say that a set of indexes $A \subseteq \{0,1, \ldots, n-1\}$ is domination contiguous if for all h, $j \in A$ and for all $0 \le i \le n$ such that $h \succeq i \succeq j$ and $i \succeq j$, it holds for $i \in A$. For easy reference we refer to Equation (33).

$$(h, j \in A \text{ and } h \succeq i \succeq j) \Rightarrow i \in A \tag{33}$$

Theorem 1:

Let the active rows set $A \subseteq \{0,1, \ldots, n-1\}$ be domination contiguous, as defined in Equation (33). Let E and $\bar{E}$ and be defined according to Equations (22), (23), (28), and (29). Then, $E \cdot F^{\otimes 2} \cdot E^T$ and $\bar{E} \cdot F^{\otimes 2} \cdot (\bar{E})^T$ are involutions. That is, Equations (27) and (32) hold.

Proof:

The theorists first note that for $0 \le i, j \le n$, the theorists have that $i \succeq j$ and $\bar{i} \succeq \bar{j}$. Thus, if A is domination contiguous then so is $\bar{A}$. As a consequence, proving that $E \cdot F^{\otimes m} \cdot E^T$ is an involution will immediately imply that $\bar{E} \cdot F^{\otimes m} \cdot (\bar{E})^T$ is an involution as well. The theorists start by noting a simple characterization of $F^{\otimes m}$. Namely, the entry at row i and column j of $F^{\otimes m}$ is easily calculated from Equation (34).

$$(F^{\otimes m})_{i,j} = \begin{cases} 1 & i \succeq j \\ 0 & \text{otherwise} \end{cases} \tag{34}$$

-continued $$((E \cdot F^{\otimes m} \cdot E^T) \cdot (E \cdot F^{\otimes m} \cdot E^T))_{p,q} = \tag{35}$$

$$\sum_{q=0}^{k-1} (E \cdot F^{\otimes m} \cdot E^T)_{p,q} \cdot (E \cdot F^{\otimes m} \cdot E^T)_{q,r} = \sum_{i \in A} (F^{\otimes m})_{h,i} \cdot (F^{\otimes m})_{i,j}$$

$$h \succeq i \text{ and } i \succeq j \tag{36}$$

To see this, consider the recursive definition of $F^{\otimes m}$ given in Equation (21). Obviously, $(F^{\otimes m})_{i,j} = 0$ if the theorists are at the upper right (n/2)×(n/2) block. That is, if $i_{m-1}$ (the MSB of i) equals 0 and $j_{m-1}$ equals 1. If this is not the case, we continue recursively in much the same fashion, with respect to i mod $2^{m-1}$ and j mod $2^{m-1}$. Namely, the theorists continue recursively with "truncated by one position" versions of the binary vectors representing i and j.

Recalling Equation (22) and the notation $|A|=k$, the theorists adopt the following shorthand: for $0 \le p$, q, $r < k$ given, let $h=\alpha_p$, $i=\alpha_q$, and $j=\alpha_r$. By the above, a straightforward derivation yields that $(E \cdot F^{\otimes m} \cdot E^T)_{p,q} = (F^{\otimes m})_{h,i}$ and $(E \cdot F^{\otimes m} \cdot E^T)_{q,r} = (F^{\otimes m})_{i,j}$. Accordingly, we get Equation (35).

Now proving Equation (27) is now equivalent to proving that the right hand side of Equation (34) equals 1 if h equals j. Recalling Equation (34), this is equivalent to showing that if $h \ne j$, then there is an even number of $i \in A$ for which Equation (36) hold. While if h=j, then there is an odd number of such i. The theorists distinguish between 3 cases.

Case 1) If h=j, then there is a single $0 \le i < n$ for which Equation (36) holds. Namely, i=h=j. Since h, $j \in A$, we have that $i \in A$ as well. Since 1 is odd, we are finished with the first case.

Case 2) If $h \ne j$ and $h \succeq j$ is false then there can be no i for which Equation (36) holds. Since 0 is an even integer, we are done with this case as well.

Case 3) If $h \ne j$ and $h \succeq j$, then the support of the binary vector $\langle j \rangle_2 = (j_0, j_1, \ldots, j_{m-1})$ is contained in and distinct from the support of the binary vector $\langle h \rangle_2 = (h_0, h_1, \ldots, h_{m-1})$. A moment of thought revels that the number of $0 \le i < n$ for which Equation (35) holds is equal to $2^{w(h)-w(j)}$, where w(h) and w(j) represent the support size of $\langle h \rangle_2$ and $\langle j \rangle_2$, respectively. Since $h \ne j$ and $h \succeq j$, we have that w(h)-w(j)>0. Thus, $2^{w(h)-w(j)}$ is even. Since h, $j \in A$, and A is domination contiguous, all of the above mentioned i are members of A. To sum up, an even number of $i \in A$ satisfy Equation (36), as required.

Now if we recall that an (r,m) Reed-Muller code has length $n=2^m$ and is formed by taking the set A to contain all indices i such that the support of $\langle i \rangle_2$ has size at least r. Clearly, such an A is domination contiguous, as defined in Equation (33). Hence, the following is an immediate corollary of Theorem 1, and states that our decoders are valid for Reed-Muller codes.

Corollary 2.

Let the active row set A correspond to an (r,m) Reed-Muller code. Let E and $\bar{E}$ be defined according to Equation (22), (23), (28), and (29), where $n=2^m$. Then, $E \cdot F^{\otimes m} \cdot E^T$ and $\bar{E} \cdot F^{\otimes m} \cdot (\bar{E})^T$ are involutions. That is, Equations (27) and (32) hold and thus the inventor's two encoders are valid.

C.4 Polar Codes Satisfy Domination Contiguity

With previous section C.3 it concluded with proving that the inventor's encoders are valid for Reed-Muller codes. The inventor's aim in this section is to prove that our encoders are valid for polar codes. In order to do so, the theorists first define the concept of a (stochastically) upgraded channel. A channel W with input alphabet X and output alphabet Y is denoted W:X→Y. The probability of receiving y∈Y given that x∈X was transmitted is denoted W(y|x). Our channels will be binary input, memoryless, and output symmetric (BMS). Binary: the channel input alphabet will be denoted as X={0, 1}. Memoryless: the probability of receiving the vector $(y_i)_{i=0}^{n-1}$ given that the vector $(x_i)_{i=0}^{n-1}$ was transmitted is $\Pi_{i=0}^{n-1} W(y_i|x_i)$. Symmetric: there exists a permutation π:Y→Y such that that for all y∈Y, π(π(y))=y and W(y|0)=W(π(y)|1).

We say that a channel W:X→Y is upgraded with respect to a channel Q:X→Z if there exists a channel Φ:Y→Z such that concatenating Φ to W results in Q. Formally, for all x∈X and z∈Z this means Q(z|x)=ΣW(y|x)·Φ(z|y). We denote W being upgraded with respect to Q as $W \succeq Q$. As will become evident shortly using the same notation for upgraded channels and binary domination is helpful. Let W:X→Y be a binary memoryless symmetric (BMS) channel. Let $W^-:X \to Y^2$ and $W^+:X \to Y^2+X$ be the "minus" and "plus" transforms defined by Arikan. Accordingly, the claim in the following lemma would be well known to one of skill in the art and very easy to prove. Still, since the theorists have not found a place in which the proof is stated explicitly, the theorists supply it as well.

Lemma 3.

Let W:X→Y be a binary memoryless symmetric (BMS) channel. Then, $W^+$ is upgraded with respect to $W^-$ as given by Equation (37).

$$W^+ \succeq W^- \tag{37}$$

Proof:

The theorists prove that $W^+ \succeq W$ and $W \succeq W^-$. Since "$\succeq$" is easily seen to be a transitive relation, the proof follows. To show that $W^+ \succeq W$, take $\Phi:Y^2 \times X \to Y$ as the channel which maps $(y_0, y_1, u_0)$ to $y_1$ with probability 1. The theorists now show that $W \succeq W^-$. Recalling that W is a BMS, the theorists denote the corresponding permutation as π. The theorists also denote by δ( ) function taking as an argument a condition. δ equals 1 if the condition is satisfied and 0 otherwise. With these definitions at hand, the theorists take $\Phi(y_0, y_1|y) = \frac{1}{2}[W(y_1|0)\cdot\delta(y_0=y)+W(y_1|1)\cdot\delta(y_0=\pi(y))]$. Consequently, the following lemma claims that both polar transformations preserve the upgradation relation.

Lemma 4.

Let W:X→Y and Q:X→Z be two BMS channels such that $W \succeq Q$ $W \otimes Q$. Then, via Equation (38), for a BMS channel W and 0≤i<n, denoted by $W_i^{(m)}$. The proposition being that the channel $W_i^{(m)}$ is symmetric. The following lemma ties the two definitions of the $\succeq$ relation.

Lemma 5.

Let W:X→Y be a BMS channel. Let the indices 0≤i, j<n be given. Then, binary domination implies upgradation as given by Equation (39).

Proof:

The theorists prove the claim by induction on m. For m=1, the claim follows from either Equation (37), or the fact that a channel is upgraded with respect to itself, depending on the case. For m>1, the theorists have by induction that $$W_{\lfloor i/2 \rfloor}^{(m-1)} \succeq W_{\lfloor j/2 \rfloor}^{(m-1)}.$$

Now, if the least significant bits of i and j are the same we use Equation (38), while if they differ the theorists use Equation (37) and the transitivity of the "$\succeq$" relation.

$$W^- \succeq Q^- \text{ and } W^+ \succeq Q^+ \tag{38}$$

$$i \succeq j \Rightarrow W_i^{(m)} \succeq W_j^{(m)} \tag{39}$$

The theorists are now ready to prove our second main result.

Theorem 6.

Let A be the active rows set corresponding to a polar code. Then, A is domination contiguous.

Proof:

The theorists must first state exactly what the theorists mean by a "polar code". Let the code dimension k be specified. Within the prior art of Arikan A equals the indices corresponding to the k channels $W_i^{(m)}$ with smallest Bhattacharyya parameter, where 0≤i<n. Other definitions are possible and will be discussed shortly. However, for now, let us use the above definition. Denote the Bhattacharyya parameter of a channel W by Z(W). As is well known, if W and Q are two BMS channels, then Equation (40) results. For a proof of this the theorists refer to Korada in "Polar Codes for Channel and Source Encoding" (Ph.D Dissertation, EPFL, 2009).

$$W \succeq Q \Rightarrow Z(W) \leq Z(Q) \tag{40}$$

The theorists deduce from Equations (39) and (40) that if $i \succeq j$, then $Z(W_i^{(m)}) \leq Z(W_j^{(m)})$. Assume for a moment that the inequality is always strict when $i \succeq j$ and i≠j. Under this assumption, j∈A must i∈A. This is a stronger claim then Equation (33), which is the definition of A being domination contiguous. Thus, under this assumption the theorists are done.

The previous assumption is in fact true for all relevant cases, but somewhat misleading: The set A is constructed by algorithms calculating with finite precision. It could be the case that i≠j, $i \succeq j$, and $Z(W_i^{(m)})$ and $Z(W_j^{(m)})$ are approximated by the same number (a tie), or by two close numbers, but in the wrong order. Thus, it might conceptually be the case that j is a member of A while i is not (in practice, the theorists have never observed this to happen). These cases are easy to check and fix, simply by removing j from A and inserting i instead. Note that each such operation enlarges the total Hamming weight of the vectors $\langle t \rangle_2$ corresponding to elements t of A. Thus, such a swap operation will terminate in at most a finite number of steps. When the process terminates, the theorists have by definition that if j∈A and $i \succeq j$ then i∈A. Thus, A is dominations contiguous.

Instead of taking the Bhattascharyya parameter as the figure of merit, the theorists note that they could alternatively have used the channel mis-decoding probability. That is, the probability of an incorrect maximum likelihood estimation of the input to the channel given the channel output, assuming a uniform input distribution. Alternatively another figure of merit the theorists could have taken is the channel capacity. The important point in the proof was that an upgraded channel has a figure of merit value that is no worse. This holds true for the other two options discussed in this paragraph.

C.5 Flexible Hardware Encoders

Figure 13:
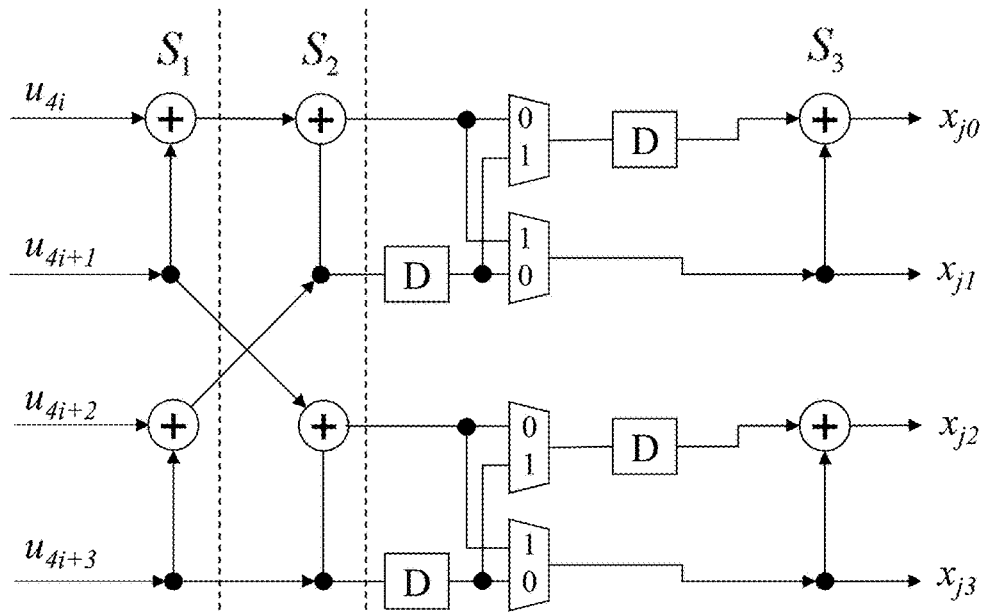
FIG. 13 depicts a semi-parallel polar encoder with n=8 and P=4 according to the prior art.

The most efficient non-systematic polar encoder implementation known to the inventors is that of Yoo et al in "Partially Parallel Architecture for Long Polar Codes (IEEE Trans Circuits Syst. II, Vol. 62(3), pp. 306-310). It is a pipelined, semi-parallel design with a throughput of P bit/Hz, where P corresponds to the level of parallelism, and is capable of encoding any polar code of length n when correct frozen bits are set to zero at its input. Referring to FIG. 13 there is depicted the architecture of an encoder for n=8 and P=4, where D denotes a delay element and the multiplexers alternate between their inputs starting with input '0'. In this section, the inventors show how this decoder can be used as the basis for our proposed systematic encoder.

Adapting this architecture to encode any code of length $n \leq n_{MAX}$ requires extracting data from different locations along the pipeline. These locations are indicated with dashed lines in FIG. 13, where the output for a code of length n can be extracted from location $S_{log_2 n}$. Selecting different sets of output is accomplished using P instances of a log $n_{MAX} \times 1$ multiplexer. In a practical system, it is unlikely that the minimum length of polar codes of interest will be 2; therefore the required multiplexers will be narrower than log $n_{MAX}$ bits.

The encoder of Yoo can be used as the component polar encoder when implementing the algorithm proposed in Section C.2 in two ways: the first targeting high throughput, the second, low implementation complexity. In the high throughput arrangement, two instances of the component encoder are used, with the output of the first modified to set the frozen bits to zero before being sent to the second instance. This requires P "AND" gates applying masks with frozen bit locations set to zero and a $(n_{MAX}/P) \times P$ memory to store said masks. Alternatively, to save implementation resources at the cost of halving the throughput, one instance of the component can be used in two passes: the output from pass is masked and then routed to the input of the encoder where it is encoded again before being presented as the encoder output. In both cases, encoding a code of length $n < n_{MAX}$ can be accomplished by setting the mask locations corresponding to bits with indexes greater than n to "0", without any changes to the component non-systematic encoder. This requires $log_2 n_{MAX} - log_2 n$ extra cycles for the data to reach the encoder output. The extra latency can be eliminated if the component non-systematic encoder is made flexible as described previously.

The systematic encoder of Arikan can be used in a configuration similar to the proposed high-throughput one. However, it requires multiplication by matrices that change when the frozen bits are changed. Therefore, its implementation requires a configurable parallel matrix multiplier that is significantly more complex than the component non-systematic encoder used in this work. In addition, since $G_{AB}^{-1}$ is different from the encoding matrix G that is used in the second step in Arikan, separate circuitry is required to implement the operations in a parallelized manner, eliminating the possibility of reusing the component encoder.

C.6 Flexible Hardware Decoders

After describing flexible encoders in the previous section, Section C.5, the inventors present flexible hardware decoder in this section, Section C.6 and flexible software decoders in the next, Section C.7. The original fast simplified successive cancellation (Fast-SSC) decoder of the inventors was capable of decoding all polar codes of a given length: it resembled a processor where the polar code is loaded as a set of instructions. By decoupling a stage's size from its index and updating the control logic, the inventors obtain a flexible Fast-SSC decoder capable of decoding any polar code up to a maximum length $n_{MAX}$. In this section, the inventors describe the necessary modifications to the Fast-SSC decoder architecture and analyze the resulting implementation.

C.6.1. Stage Indexes and Sizes

The Fast-SSC decoder is organized into stages with a stage $S_i$ corresponding to a constituent polar code of length $2^i$. In the inventive flexible decoder, the inventors modify these two values, so that the aforementioned relationship only holds when the code length $n=n_{MAX}$. When $n_{MAX}/n=r>1$, a stage $S_i$ corresponds to a constituent code of length $2^i/r$. The memory allocated for a stage $S_i$ is always calculated assuming $n=n_{MAX}$. The decoder always starts from $S_{log_2 n_{MAX}}$, corresponding to a polar code of length $n \leq n_{MAX}$, and proceeds until it encounters a constituent code whose output can be estimated according to the rules of the Fast-SSC algorithm.

C.6.2. Implementation Results

Since memory is accessed as words containing multiple LLR or bit-estimate values, the limits used to determine the number of memory words per stage must be changed to accommodate the new n value. The rest of the decoder implementation remains unchanged from that of the inventors within their Fast-SSC implementations. These limits are now provided as inputs to the decoder. Referring to Table C1 there are compared the inventive flexible decoder ($n_{MAX}=32768$) with the inventors prior Fast-SSC decoder (n=32768) when both are implemented using the Altera Stratix IV EP4SGX530KH40C2 field-programmable gate-array (FPGA). It can be observed that the change in resource utilization is negligible as a result of the localized change in limit calculations. The operating frequency was not affected either. As a results the two decoders have the same throughput and latency. When decoding a code of length $n < n_{MAX}$, the flexible decoder has the same latency (in clock cycles) as the Fast-SSC decoder for a code of length n.

TABLE C1

Implementation of a Flexible Polar Code Decoder according to an embodiment of the invention compared to that of a Fast-SSC of the inventors for $n_{MAX}$ = 32768 on Altera Stratix IVFPGA

| Decoder | LUTs | FF | RAM (bits) | f (MHz) |
| --- | --- | --- | --- | --- |
| Fast-SSC (Inventors) | 24,066 | 7,231 | 536,136 | 102 |
| Embodiment of Invention | 23,583 | 7,207 | 536,136 | 102 |

C.7: Flexible Software Decoders

High-throughput software decoders require vectorization using single-instruction multiple-data (SIMD) instructions in addition to a reduction in the number of branches. However, these two considerations significantly limit the flexibility of the decoder to the point that the lowest latency decoders in literature are compiled for a single polar code as analysed by the inventors. In this section, the inventors present a software Fast-SSC decoder balancing flexibility and decoding latency. The inventive decoder has 30% higher latency than a fully specialized decoder, but can decode any polar code of length $n \leq n_{MAX}$. As will discussed later in this section, there are two additional advantages to the inventive flexible software decoder: the resulting executable size is an order of magnitude smaller, and it can be used to decode very long polar codes for which an unrolled decoder cannot be compiled.

C.7.1 Memory

Unlike in hardware decoders, it is simple to access an arbitrary memory location in software decoders. The LLR memory in the inventive software decoder is arranged into stages according to constituent code sizes. When a code of length $n \leq n_{MAX}$ is to be decoded, the channel LLRs are loaded into stage $S_{\log_2 n}$, bypassing any stages with a larger index. The bit-estimate memory is arranged into a flat structure of length $n_{MAX}$ bits. Such a layout was found by the inventors to decrease decoding latency by eliminating superfluous copy operations. For a decoder of length $n \leq n_{MAX}$, the decoder writes starting from bit index 0. Once decoding is completed, the estimated codeword will occupy the first n bits of the bit estimate memory, which are provided as the decoder output.

C.7.2. Vectorization

The unrolled software decoder presented by the inventors specifies input sizes for each command at compile time. This enables SIMD vectorization without any loops, but limits the decoder to a specific polar code. To efficiently utilize SIMD instructions while minimizing the number of loops and conditionals, the inventors employ dynamic dispatch in the inventive decoder. Each decoder operation in implemented, using SIMD instructions and C++ templates, for all stage sizes up to $n_{MAX}$. These differently sized implementations are stored in array indexed by the logarithm of the stage size. Therefore two branch operations are used: the first to look up the decoding operation, and the second to look up the correct size of that operation. This is significantly more efficient than using loops over the SIMD word size.

C.7.3 Results

The inventors compare the latency of the inventive vectorized flexible decoder with a non-vectorized version and with their fully unrolled decoder using floating-point values. Table C2 compares the inventive flexible, vectorized decoder with a flexible, non-explicitly-vectorized decoder (denoted by 'Scalar') and a fully unrolled (denoted by 'Unrolled') one running on an Intel Core 2 Quad Q9550 with SSE4 extensions. All decoders were decoding a (32768, 29492) polar code using the Fast-SSC algorithm, floating-point values, and the min-sum approximation. The flexible decoders had $n_{MAX}$=32768. From the results in the table, it can be seen that the vectorized decoder has 41% the latency (or 2.4 times the throughput) of the non-vectorized version. Compared to the code-specific unrolled decoder, the inventive decoder has 130% the latency (or 76% the throughput). In addition to the two layers of indirection in the inventive decoder, the lack of inlining contributes to this increase in latency. In the unrolled decoder, the entire decoding flow is known at compile time, allowing the compiler to inline function calls, especially those related to smaller stages. This information is not available to the flexible decoder.

Results for $n < n_{MAX}$ are shown in Table C3 where n=32768 for the flexible decoders and the code used was a (2048, 1723) polar code. The advantage the vectorized decoder has over the non-vectorized one remains similar to the $n=n_{MAX}$ case at 48% the latency. The gap between the inventive decoder and the unrolled one increases to 1.8 times the latency, as a result of using a shorter code where a smaller proportion of stage operations are inlined in the former.

In addition to decoding different codes, the inventive flexible decoder has an advantage over the fully unrolled one in terms of resulting executable size and the maximum length of the polar code to be decoded. The size of the executable corresponding to the inventive decoder with $n_{MAX}$=32768 was 0.44 MB with 3 kB to store the polar code instruction in an uncompressed textual representation; whereas that of the unrolled decoder was 3 MB. In terms of polar code length, the GNU C++ compiler was unable to compile an unrolled decoder for a code of length $2^{24}$ even with 32 GB of RAM; while the inventive decoder did not exhibit any such issues.

TABLE C2

Speed of Inventive Vectorised Decoder compared with Non-Vectorised and Fully-Unrolled Decoders with n = $n_{MAX}$ = 32768 and k = 29492

| Decoder | Latency (µs) | Throughput (Mbps) |
|---|---|---|
| Scalar Fast-SSC | 606.6 | 48 |
| Unrolled Fast-SSC | 188.7 | 156 |
| Embodiment of Invention Fast-SSC | 247.5 | 119 |

TABLE C3

Speed of Inventive Vectorised Decoder compared with Non-Vectorised and Fully-Unrolled Decoders for a (2048, 1723) Polar Code and $n_{MAX}$ = 32768

| Decoder | Latency (µs) | Throughput (Mbps) |
|---|---|---|
| Scalar Fast-SSC | 36.7 | 47 |
| Unrolled Fast-SSC | 9.8 | 176 |
| Embodiment of Invention Fast-SSC | 17.6 | 98 |

C.8. Application to Quantum Key Distribution

Quantum key distribution (QKD) is a method that exploits quantum mechanics to provide guaranteed security when transmitting information. QKD occurs over two channels: a quantum one used to transmit the secret information and a classical one used for protocol overhead. The quantum channel is modeled as a binary symmetric channel (BSC) for discrete-value (DV) QKD, or an additive white Gaussian noise (AWGN) channel for continuous-value (CV) distribution. Moreover, it suffers from high noise levels, requiring powerful error-correcting codes of rates close to the channel capacity to correctly and securely transmit information.

It has been demonstrated within the prior art that polar codes ($n > 2^{24}$) provide very high efficiency when used for QKD, where the efficiency factor is defined as the ratio of the code rate to the channel capacity, i.e. $\beta = R/C$. However, the decoder used the successive-cancellation algorithm and therefore yielded a throughput of only 8.3 Mbps; while state of the art DVQKD systems already exceed 15 Mbps.

When using the min-sum algorithm to decode polar codes of length $2^{24}$ transmitted over the BSC, the inventors observed that the resulting frame error rate (FER) was two to three times that of a significantly slower SPA-based decoder. While the FER can be improved by lowering the code rate; in QKD systems, it is desirable to have rates that are at least 95% of the channel capacity. To resolve this issue, the inventors present a new approximation for the sum-product algorithm (SPA) that suffered no error-rate degradation in our simulation, yet offered ~85% the throughput of the min-sum decoder. Finally the inventors show how the inventive software decoder can be used to decode polar codes of length $n=2^{24}$ at eight times the throughput of prior art that yielded only 8.3 Mbps.

C.8.1 SPA Approximation

Polar decoders use the same parity check update as the ⊞ operation in SPA, which is defined for two input LLRs as given by Equation (41). Using the Jacobi logarithm, this can be rewritten as Equation (42) wherein the correction function $f_+$ is defined by Equation (43).

$$a \boxplus b = 2 \tan h^{-1}(\tan h(a/2) \tan h(b/2)) \quad (41)$$

$$a \boxplus b = \text{sgn}(a)\text{sgn}(b)\min(|a|,|b|) + f_+(|a|+|b|) - f_+(|a|-|b|) \quad (42)$$

$$f_+(x) = \log(1+e^{-x}) \quad (43)$$

The first part of Equation (42) is the well-known min-sum approximation that is well suited for hardware and software implementations. The correction function however, has high complexity and is often omitted or approximated using lookup tables in hardware decoders. A good approximation in a software decoder should only use functions with direct mapping to processor instructions, i.e. it cannot use logarithms and exponentiation. Furthermore, it should minimize operations that cannot be implemented using SIMD instructions. A degree-three polynomial, with a max( ) function to ensure that the result decays to zero, meets those conditions and provides a very good approximation with a coefficient of determination $R^2$=0.999. The proposed inventive approximation being given by Equation (44) where the operations used, max( ), multiplication and addition, all have SIMD implementations on modern processors.

$$\tilde{f}_+(x) = \max(0, -0.0076x^3 + 0.1010x^2 - 0.4463x + 0.6759) \quad (44)$$

C.8.2. Results

Figure 14:
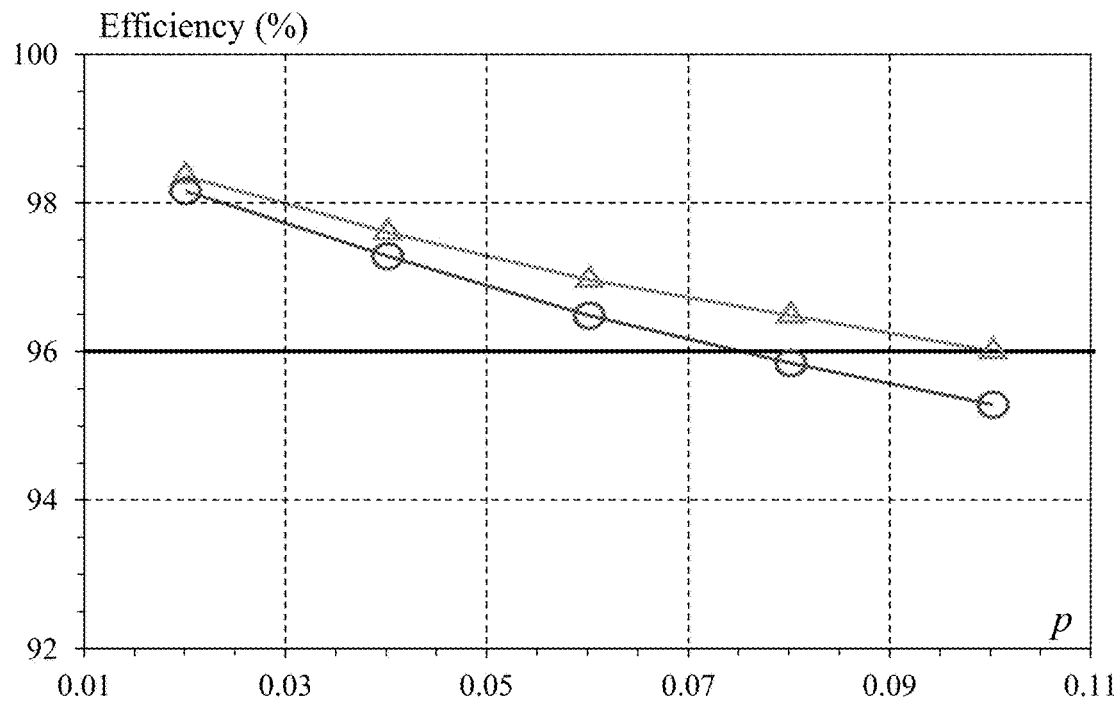
FIG. 14 depicts the efficiency relative to the capacity of a binary symmetric channel using the approximate SPA decoder according to an embodiment of the invention with a prior art min-sum decoder, both for codes of length $2^{24}$.

Now referring to FIG. 14 there is presented the efficiency of the inventive SPA approximation compared to that of a min-sum decoder for codes of length $2^{24}$ and different rates. The channel used was a BSC with a probably of crossover p∈[0.02,0.10] and the rates of the codes were chosen so that the FER was in [0.08,0.09]. The inventors observe that the efficiency gap between the two decoding algorithms grows as p increases. For p≥0.08, the efficiency of the min-sum decoder drops below 95%, whereas that of the approximate SPA decoder remain ≥95% until p=0.10.

In terms of decoding speed, the approximate decoder is 15% slower than the min-sum-based decoder. Table C4 presents the latency and information throughput of the inventive approximate SPA decoder, the min-sum decoder, and the SPA decoder of the prior art where the first two are implemented using the flexible software decoder architecture described in Section C7. The latency numbers include the time required to copy data in and out of the decoder. From Table C4, it can be seen that the approximate SPA decoder is three to 7.7 times as fast as that of the SPA decoder of the prior art, depending on which processor is used. The inventors present the approximate SPA results using two processors: one slower and one faster than the Intel i5-670 used in the prior art as the inventors did not have access to the last processor. The min-sum decoder is 15% faster than the approximate SPA decoder. Therefore, the min-sum decoder is suitable when the channel conditions are good since it is faster; whereas, the approximate SPA decoder should be used when the channel conditions worsen as it has better error-correction performance.

D: Decoding Tree Unrolling for Software Based List Decoders

D.1 List Decoder Overview

D1.1. List-CRC Decoding

As discussed supra in respect of Section B.1 a list decoder expands to decoding along multiple paths up to a predetermined limit L. When this limit is reached the list is pruned by retaining only the L most reliable paths. When decoding is over, the estimated codeword with the largest reliability metric is selected as the decoder output. By exploiting a cyclic redundancy check (CRC) as a metric for selecting the final decoder output the error-correction performance can be increased significantly in addition to which CRC allows an adaptive decoder to be employed where the list size starts at two and is gradually increased until the CRC is satisfied or a maximum list size is reached.

Initially, polar list decoders used likelihood and log-likelihood values to represent reliabilities but later, log-likelihood ratios (LLRs) were used to reduce the memory used by a factor of two and to reduce the processing complexity. In addition to the messages and operations required a reliability metric $PM_i^l$ for each path l that is updated for every estimated bit i is generated using Equation (45). Importantly, the path metric is updated when encountering both information and frozen bits.

D.1.2 Fast-SSC Decoding

An SC decoder traverses the code tree until reaching leaf nodes corresponding to codes of length one before estimating a bit. This, as discussed supra, is superfluous as the output of subtrees corresponding to constituent codes of rate 0 or rate 1 of any length can be estimated without traversing their sub-trees. The output of a rate-0 node is known a priori to be an all-zero vector of length $N_v$; while that of rate-1 can be found by applying threshold detection element-wise on $\alpha_v$ so that Equation (46) applies.

$$PM_i^l = \begin{cases} PM_i^{i-1} & \text{when } \alpha_v[j] \geq 0 \\ PM_i^{i-1} - |\alpha_v| & \text{otherwise} \end{cases} \quad (45)$$

$$\beta_v[i] = h(\alpha_i[i]) = \begin{cases} 0 & \text{when } \alpha_v[i] \geq 0 \\ 1 & \text{otherwise} \end{cases} \quad (46)$$

$$\beta_v[i] = \begin{cases} 0 & \text{when } \sum_j \alpha_v[j] \geq 0 \\ 1 & \text{otherwise} \end{cases} \quad (47)$$

$$\beta_v[i] = \begin{cases} HD[i] \oplus \text{parity} & \text{when } i = j \\ HD[i] & \text{otherwise} \end{cases} \quad (48)$$

Figure 15:
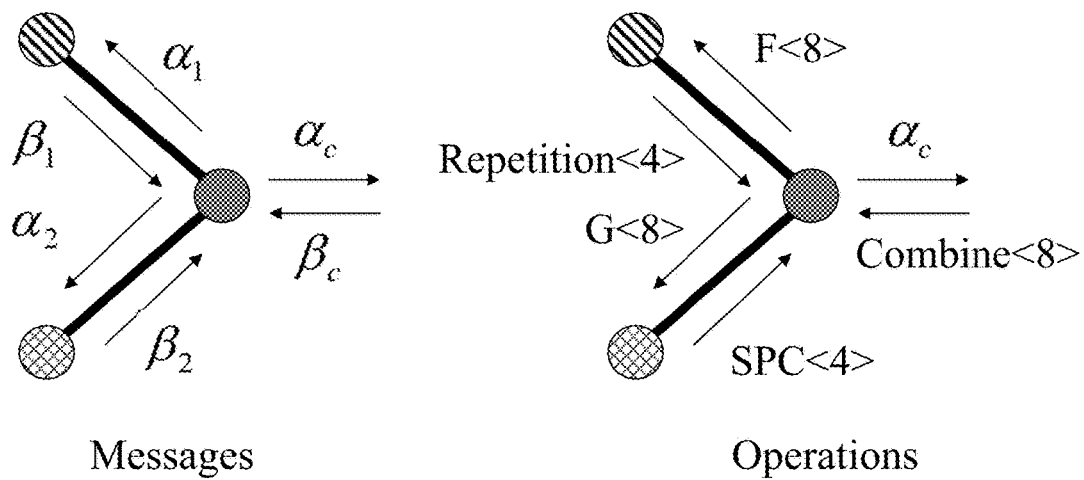
FIG. 15 depicts Fast-SSC decoder graphs for an (8,4) polar code.

The Fast-SSC algorithm utilizes low-complexity maximum-likelihood (ML) decoding algorithms to decode constituent repetition and single-parity check (SPC) codes instead of traversing their corresponding sub-trees. The ML-decision for a repetition code is given by Equation (47). The SPC decoder performs threshold detection on its output to calculate the intermediate value HD. The parity of HD is calculated using modulo-2 addition and the least reliable bit is found according to Equation (48). The final output of the SPC decoder is then given by Equation (9). Referring to FIG. 15 there is depicted the messaging and operations of a Fast-SSC decoder tree for the (8, 4) code. The Fast-SSC decoder and its software implementation exploit additional specialized constituent decoders that are not used in this work. In addition, the operations mentioned in this section and implemented by the inventors within their previous work present a single output and therefore cannot be applied directly to list decoding. Accordingly, the inventors show below how these are adapted to present multiple candidates and used in a list decoder.

D.1.3. Unrolling Software Decoders

The software list decoder described supra in respect of Section B is run-time configurable, i.e. the same executable is capable of decoding any polar code without recompilation. While flexible, this limits the achievable decoding speed. The inventors have shown that generating a decoder for a specific polar code yielded significant speed improvement by replacing branches with straight-line code and increasing the utilization of single instruction, multiple data (SIMD) instructions. This process is managed by a developed CAD tool that divides the process into two parts: decoder tree optimization, and C++ code generation.

For the list decoder described in respect of this Section D the inventors have applied this optimization tool using a subset of the nodes available to the complete Fast-SSC algorithm: Rate-0 (Frozen), Rate-1 (information), repetition, and SPC nodes. The decoder tree optimizer traverses the decoder tree starting from its root. If a sub-tree rooted at the current node has a higher decoding latency than an applicable Fast-SSC node, it is replaced with the latter. If there are not any Fast-SSC nodes that can replace the current tree, the optimizer moves to the current node's children and repeats the process.

Once the tree is optimized, the corresponding C++ code is generated. All functions are passed the current $N_v$ value as a template parameter, enabling vectorization and loop unrolling. Listings 1 and 2 below show a loop-based decoder and an unrolled one for the (8, 4) code in FIG. 15, respectively. In the loop-based decoder, both iterating over the decoding operations and selecting an appropriate decoding function (called an operation processor) to execute involve branches. In addition, the operation processor does not know the size of the data it is operating on at compile-time; and as such, it must have another loop inside. The unrolled decoder can eliminate these branches since both the decoder flow and data sizes are known at compile-time.

---
Listing 1: Loop Based (8,4) Fast-SSC Decoder
---

```
for (unsigned int i=0;i<operation_count; ++i
    {operation_processor=fetch_operation_processor(i);
    Operation_processor.execute(α_v;&α_r;&α_l;β_l;β_r;&β_v) ;}
```

---
Listing 2: Unrolled (8,4) Fast-SSC Decoder
---

$\alpha_1$ = F < 8 > ($\alpha_c$) ;
$\beta_1$ = Repetition < 4 > ($\alpha_1$) ;
$\alpha_1$ = G < 8 > ($\alpha_c$, $\beta_1$) ;
$\beta_2$ = SPC < 4 > ($\alpha_2$) ;
$\beta_c$ = Combine < 8 > ($\beta_1$, $\beta_2$) ;

D.2 Inventive List-Decoding Algorithm

When performing operations corresponding to a rate-R node, a list decoder with a maximum list size L performs the operations F, G, and Combine as given by Equations (2) to (4) respectively on each of the paths independently. It is only at the leaf nodes that interaction between the paths occurs: the decoder generates new paths and retains the most reliable L ones. A significant difference between the baseline SC-list decoder and the proposed algorithm is that each path in the former generates two candidates, whereas in the latter, the leaf nodes with sizes larger than one can generate multiple candidates for each path.

All path-generating nodes store the candidate path reliability metrics in a priority queue so that the worst candidate can be quickly found and replaced with a new path when appropriate. This is an improvement over the invention described in respect of Section B, where path reliability metrics are kept sorted at all times by using a red-black (RB) tree. The most common operation in candidate selection is locating the path with the minimum reliability, which is an O(log L) operation in RB-trees, the order of the remaining candidates is irrelevant. A heap-backed priority queue provides O(1) minimum-value look up and O(log L) insertion and removal, and is therefore more efficient than an RB tree for the intended application.

Rate-0 nodes do not generate new paths; however, like their length-1 counterparts in SC-list decoding, they alter path reliability values. The path metric was updated according to Equation (48) which can be extended to rate-0 nodes of length >1 so that we obtain Equation (49) where t is the leaf-node index.

$$PM_l^i = \begin{cases} PM_l^{i-1} & \text{when } h(\alpha_v) = 0 \\ PM_l^{i-1} - |\alpha_v| & \text{otherwise} \end{cases} \quad (48)$$

$$PM_l^i = PM_l^{i-1} - \sum h(\alpha_i[i])|\alpha_v[i]| \quad (49)$$

The inventors now describe how each of the remaining nodes generates its output paths and calculates the corresponding reliability metrics. The process of retaining the L most reliable paths is described in Algorithm 3. Performing the candidate selection in two passes and storing the ML decisions first are necessary to prevent candidates generated by the first few paths from overwriting the input for later ones.

---
Algorithm 3: Candidate Selection Process
--- for s ∈ sourcePaths do
    Generate candidates
    Store reliability of all candidates except the ML one
    Store ML decision
end for
for p ∈ candidates do
    if fewer than L candidates stored then
        Store p
    else if $PM_p^t$ < min. stored candidate reliability then
        Replace min. reliability candidate with p
    end if
end for

D.2.1. Rate-1 Decoders

A decoder for a length $N_v$ rate-1 constituent code can provide up to $2N_v$ candidate codewords. This approach is impractical as it scales exponentially in $N_v$. Furthermore, the inventor has shown through simulations that not all candidates need to be tested. Instead, the inventors use the low-complexity candidate-enumeration method of Chase decoding such as described in Section B.

The maximum-likelihood decoding rule for a rate-1 code is given by Equation (46). Additional candidates are generated by flipping the least reliable bits both independently and simultaneously. Empirically, the inventors found that considering only the two least-reliable bits, whose indexes are denoted $min_1$ and $min_2$, is sufficient to match the performance of SC list decoding. Therefore, for each source path s, the proposed rate-1 decoder generates four candidates with the reliability values given by Equations (50A) to (50D) respectively where $PM_0^t$ corresponds to the ML decision, $PM_1^t$ to the ML decision with the least-reliable bit flipped, $PM_2^t$ to the ML decision with the second least-reliable bit flipped, and $PM_3^t$ to the ML decision with the two least-reliable bits flipped.

$$PM_0^t = PM_s^{t-1} \quad (50A)$$

$$PM_1^t = PM_s^{t-1} - |\alpha_v[min_1]| \quad (50B)$$

$$PM_1^t = PM_s^{t-1} - |\alpha_v[\min_2]| \quad (50C)$$

$$PM_1^t = PM_s^{t-1} - |\alpha_v[\min_1]| - |\alpha_v[\min_2]| \quad (50D)$$

D.2.2. SPC Decoders

The ML decision of an SPC decoder is calculated according to Equation (48). The associated path reliability is therefore given by Equation (51).

$$PM_0^t = \begin{cases} PM_s^{t-1} & \text{when parity} = 0 \\ PM_s^{t-1} - |\alpha_v[\min_1]| & \text{otherwise} \end{cases} \quad (51)$$

When generating the candidate paths, simulation results, presented in Section D.5 below, show that flipping combinations of the four least-reliable bits caused only a minor degradation in error-correction performance for L<16 and SPC code lengths greater than 4. The error-correction performance change was negligible for smaller L values. Increasing the number of least-reliable bits under consideration decreased the decoder speed to the point where ignoring SPC codes of length >4 yielded a faster decoder.

We define q as an indicator function so that q=1 when the parity check is satisfied and 0 otherwise. Using this notation, the reliabilities of the remaining candidates are given by Equations (52A) to (52G) respectively.

$$PM_1^t = PM_s^{t-1} - q|\alpha_v[\min_1]| - |\alpha_v[\min_2]| \quad (52A)$$

$$PM_2^t = PM_s^{t-1} - q|\alpha_v[\min_1]| - |\alpha_v[\min_3]| \quad (52B)$$

$$PM_3^t = PM_s^{t-1} - q|\alpha_v[\min_1]| - |\alpha_v[\min_4]| \quad (52C)$$

$$PM_4^t = PM_s^{t-1} - |\alpha_v[\min_2]| - |\alpha_v[\min_3]| \quad (52D)$$

$$PM_5^t = PM_s^{t-1} - |\alpha_v[\min_2]| - |\alpha_v[\min_4]| \quad (52E)$$

$$PM_6^t = PM_s^{t-1} - q|\alpha_v[\min_3]| - |\alpha_v[\min_4]| \quad (52F)$$

$$PM_7^t = PM_s^{t-1} - q|\alpha_v[\min_1]| - |\alpha_v[\min_2]| - |\alpha_v[\min_3]| - |\alpha_v[\min_4]| \quad (52G)$$

These reliability values correspond to flipping an even number of bits compared to the ML decision so that the single parity check constraint remains satisfied. Applying this rule when the input already satisfies the SPC constraints generates candidates where no bits are flipped, two bits are flipped, and four bits are flipped. Otherwise, one and three bits are flipped. As will be shown via simulation results in Section D.6, for SPC codes of length >4 and L=2, only the candidates corresponding to the ML decision, $PM_1^t$, $PM_2^t$, and $PM_3^t$ need to be evaluated.

D.3 Repetition Decoders

A repetition decoder has two possible outputs: the all-zero and the all-one codewords whose reliabilities are given by Equations (53A) and (53B) respectively where $PM_0^t$ and $PM_1^t$ are the path reliability values corresponding to the all-zero and all-one codewords, respectively. The all-zero reliability is penalized for every input corresponding to a 1 estimate, i.e. negative LLR; and the all-one for every input corresponding to a 0 estimate. The ML decision is found according to arg $\max_i(PM_i^t)$, which is the same as performing Equation (47).

$$PM_0^t = PM_s^{t-1} - \sum_i |\min(\alpha_v[i], 0)| \quad (53A)$$

-continued $$PM_1^t = PM_s^{t-1} - \sum_i |\max(\alpha_v[i], 0)| \quad (53B)$$

D.3. Implementation

Within this section the inventors describe the methods used to implement their inventive algorithm on an x86 CPU supporting SIMD instructions. The inventors created two versions: one for CPUs that support the AVX instructions, and the other using SSE for CPUs that do not. For brevity, within this specification only the AVX implementation is discussed when both implementations are similar. In cases where they differ significantly, both implementations are presented. The inventors use 32-bit floating-point (float) to represent the binary valued β, in addition to the real-valued α, since it improves vectorization of the g operation as explained in Section D.3.3.

D.3.1. Memory Layout for α Values

The memory is organized into stages: the input to all constituent codes of length $N_v$ is stored in stage $S_{\log_2 N_v}$. Due to the sequential nature of the decoding process, only $N_v$ values need to be stored for a stage since new old values are discarded when new ones are available. For example, the input to SPC node of size 4 in FIG. 15, will be stored in $S_2$, overwriting the input to the repetition node of the same size.

When using SIMD instructions, memory must be aligned according the SIMD vector size: 16-byte and 32-byte boundaries for SSE and AVX, respectively. In addition, each stage is padded to ensure that its size is at least that of the SIMD vector. Therefore, a stage of size $N_v$ is allocated max($N_v$,V) elements, where V is the number of α values in a SIMD vector, and the total memory allocated for storing α values is $$N + L \sum_{i=0}^{\log_2 N - 1} \max(2^i, V)$$

elements; where the values in stage $S_{\log_2 N}$ are the channel reliability information that are shared among all paths and L is the list size.

During the candidate forking process at a stage $S_i$, a path p is created from a source path s. The new path p shares all the information with s for stages $\in [S_{\log N}, S_i]$. This is exploited in order to minimize the number of memory copy operations by updating memory pointers when a new path is created. For stages $\in [S_0, S_i]$, path p gets its own memory since the values stored in these stages will differ from those calculated by other descendants of s.

D.3.2. Memory Layout for β Values

Memory for β values is also arranged into stages. However, since calculating $\beta_v$ from Equation (4) requires both $\beta_l$ and $\beta_r$, values from left and right children are stored separately and do not overwrite each other. Once alignment and padding are accounted for, the total memory required to store β values is $$L * \left( N + 2 \sum_{i=0}^{\log_2 N - 1} \max(2^i, V) \right)$$

As stage $S_{\log N}$ stores the output candidate codewords of the decoder, which will not be combined with other values, only L, instead of 2L, memory blocks are required. Stored β information is also shared by means of memory pointers. Candidates generated at a stage $S_i$ share all information for stages $\in [S_0, S_i]$.

D.3.3. Rate-R and Rate-0 Nodes

Exploiting the sign-magnitude floating-point representation defined in IEEE-754, allows for efficient vectorized implementation of the $f$ operation in Equation (54A). Extracting the sign and calculating the absolute values for $f$ become simple bit-wise AND operations with the appropriate mask. Then considering the g operation using Equation (54B) and using $\beta \in \{+0.0, -0.0\}$ instead of $\{0,1\}$ this can be re-written as Equation (55).

$$\alpha_l[i] = F(\alpha_v[i], \alpha_v[i+N_v/2]) \qquad (54A)$$
$$\text{sgn}(\alpha_v[i])\text{sgn}(\alpha_v[i+N_v/2])\min(\alpha_v[i], \alpha_v[i+N_v/2])$$

$$\alpha_r[i] = G(\alpha_v[i], \alpha_v[i+N_v/2], \beta_l[i]) \qquad (54B)$$
$$= \alpha_v[i+N_v/2] - \beta_l[i] * \alpha_v[i]$$

$$\alpha_v[i+N_v/2] + \beta_l[i] \oplus \alpha_v[i] \qquad (55)$$

Replacing the multiplication (*) with an XOR (⊕) operation in Equation (55) is possible due to the sign-magnitude representation of IEEE-754. Listing 4 shows the corresponding AVX implementations of the $f$ and g functions using the SIMD intrinsic functions provided by GCC. For clarity of exposition, m256 is used instead of _ _m256 and the _ _m256_ is removed from the intrinsic function names. Rate-0 decoders set their output to the all-zero vector using store instructions. The path reliability (PM) calculation (49) is implemented as in Listing 5.

---

Listing 4: Vectorized f and g Functions

```
template<unsigned int N_v>
void G(α*α_IN, α*α_OUT,β*β_IN ) {
    for (unsigned int i = 0 ; i < N_v / 2 ;i+ = 8 ){
        m256 α_l = load _ps(α_IN + i);
        m256 α_r = load _ps(α_IN + i + N_v / 2);
        m256 β_l = load _ps(β_IN + i);
        m256 α_l' = xor _ps(β_l, α_l);
        m256 α_0 = add _ps(α_l, α_l');
        store _ps(α_OUT + i, α_0)
    }
}
template<unsigned int N_v>
void F(α*α_IN, α*α_OUT ) {
    for (unsigned int i = 0 ; i < N_v / 2 ; i+ = 8 ){
        m256 α_l = load _ps(α_IN + i);
        m256 α_l = load _ps(α_IN + i + N_v / 2);
        m256 sign = and _ps(xor _ps(α_l, α_r), SIGN _MASK);
        m256 |α_l| = andnot _ps(α_l, SIGN _MASK);
        m256 |α_r| = andnot _ps(α_r, SIGN _MASK);
        m256 α_0 = or _ps(sign, min_ ps(|α_l|,|α_r|));
        store _ps(α_OUT + i, α_0)
    }
}
```

---

Listing 5: Path Reliability Update in Rate-0 Decoders

```
M256 ZERO = set1 _ ps(0,0) ;
M256 PMv = ZERO ;
for (unsigned int i = 0 ; i < N_v / 2 ; i+ = 8){\
    PMv = add _ ps(PMv, min_ ps(load _ ps(α_IN + 1),ZERO)) ;
}
PM = Σ_i PMv[i]
```

---

D.3.4. Rate-1 Nodes

Since $\beta \in \{+0.0, -0.0\}$ and α values are represented using sign-magnitude notation, the threshold detection in Equation (46) is performed using a bit mask (SIGN_MASK).

Sorting networks can be implemented using SIMD instructions to efficiently sort data on a CPU. For rate-1 nodes of length 4, a partial sorting network (PSN), implemented using SSE instructions, is used to find the two least reliable bits. For longer constituent codes, the reliability values are reduced to two SIMD vectors: the first, $v_0$ containing the least reliable bit and the second, $v_1$, containing the least reliable bits not included in $v_0$. When these two vectors are partially sorted using the PSN, $\min_2$ will be either the second least-reliable bit in $v_0$ or the least-reliable bit in $v_1$.

D.3.5. Repetition Nodes

The reliability of the all-zero output $PM_0^t$ is calculated by accumulating the $\min(\alpha_v[i], 0.0)$ using SIMD instructions. Similarly, to calculate $PM_1^t$, $\max(\alpha_v[i], 0.0)$, are accumulated.

D.3.6. SPC Nodes

For SPC decoders of length 4, all possible bit-flip combinations are tested; therefore, no sorting is performed on the bit reliability values. For longer codes, a sorting network is used to find the four least-reliable bits. When L=2, only the two least reliable bits need to be located. In that case, a partial sorting network is used as described in Section C.3. Since the SPC code of length 2 is equivalent to the repetition code of the same length, we only implement the latter.

D.4. Adaptive Decoder

The concatenation with a CRC provides a method to perform early termination analogous to a syndrome check in belief propagation decoders. This can be used to gradually increase the list size. In this inventive approach by the inventors we initially decode using a Fast-SSC polar decoder, and if the CRC is not satisfied, switch to the list decoder with the target $L_{MAX}$ value. The latency of this adaptive approach is given by Equation (56) where L(L) and L(F) are the latencies of the list and Fast-SSC decoders, respectively. The improvement in throughput stems from the Fast-SSC having lower latency than the list decoder. Once the frame error rate ($FER_F$) at the output of the Fast-SSC decreases below a certain point, the overhead of using that decoder is compensated for by not using the list decoder. The resulting information throughput in bit/s is given by Equation (57).

$$L(A_{MAX}) = L(L) + L(F) \qquad (56)$$

$$T = \frac{k}{(1 - FER_F) \cdot L(F) + FER_F \cdot L(L)} \qquad (57)$$

Determining whether to use adaptive decoder depends on the expected channel conditions and the latency of the list decoder as dictated by $L_{MAX}$. This is demonstrated in the comparison with the LDPC codes in Section D.6 below.

D.5 Performance

D.5.1. Methodology

All simulations were run on a single core of an Intel i7-2600 CPU with a base clock frequency of 3.4 GHz and a maximum turbo frequency of 3.8 GHz. Software-defined radio (SDR) applications typically use only one core for decoding, as the other cores are reserved for other signal processing functions. The decoder was inserted into a digital communication link with binary phase-shift keying (BPSK) and an additive white Gaussian noise (AWGN) channel with random codewords.

Throughput and latency numbers include the time required to copy data to and from the decoder and are measured using the high precision clock from the Boost Chrono library. The inventors report the decoder speed with turbo frequency boost enabled and use the term polar-CRC to denote the result of concatenating a polar code with a CRC. This concatenated code is decoded using a list-CRC decoder. The dimension of the polar code is increased to accommodate the CRC while maintaining the overall code rate; e.g. a (1024, 512) polar-CRC code with an 8-bit CRC uses a (1024, 520) polar code.

D.5.2 Choosing a Suitable CRC Length

Using a CRC as the final output selection criterion significantly improves the error-correction performance of the decoder. The length of the chosen CRC also affects the error correction performance depending on the channel conditions as presented and discussed supra in Section B with respect to FIG. 8 wherein this phenomenon is demonstrated for an (1024; 860) polar-CRC code using 8- and 32-bit CRCs and L=128. FIG. 8 shows that the performance is better at lower $E_b/N_0$ values when the shorter CRC is used. The trend is reversed for better channel conditions where the 32-bit CRC provides an improvement >0.5 dB compared to the 8-bit one. Therefore, the length of the CRC can be selected to improve performance for the target channel conditions.

D.5.3. Error-Correction Performance

Figure 16:
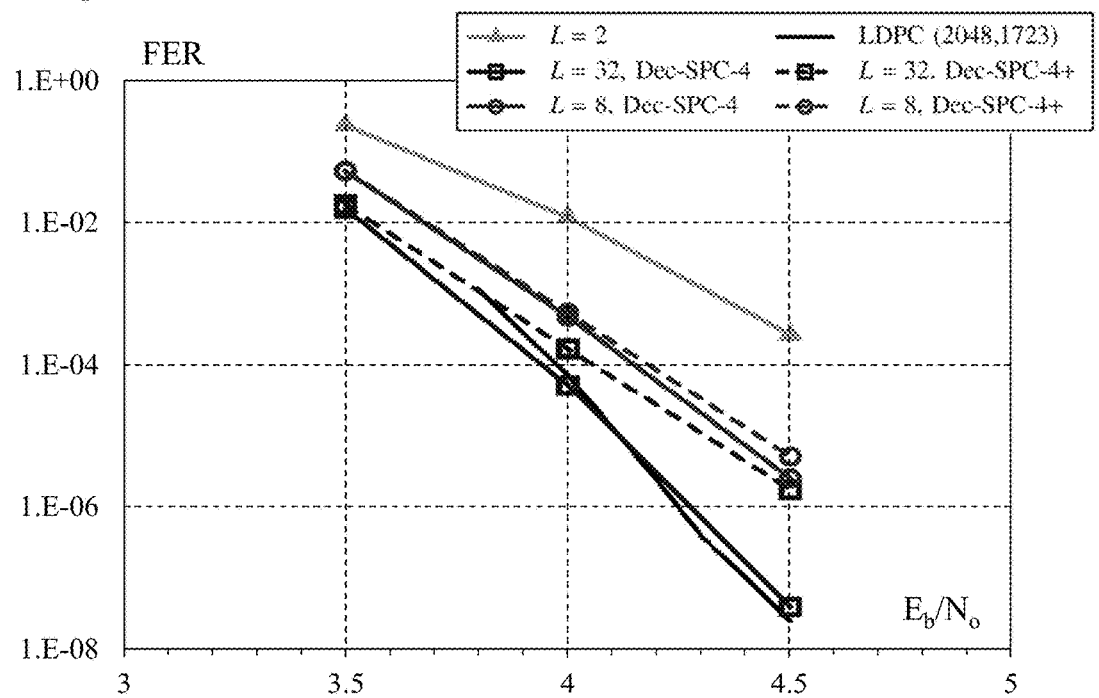
FIG. 16 depicts the FER of the polar-CRC (2048, 1723) code using a decoder according to an embodiment of the invention with different list sizes, with and without, associated SPC decoders.

The error-correction performance of the proposed decoder matches that of the SC-List decoder when no SPC constituent decoders of lengths greater than four are used. The longer SPC constituent decoders, denoted SPC-8+, only consider the four least-reliable bits in their inputs. This approximation only affects the performance when L>2. FIG. 16 illustrates this effect by comparing the FER of different list sizes with and without SPC-8+ constituent decoders, labeled Dec-SPC-4D and Dec-SPC-4+, respectively. Since for L=2, the SPC constituent decoders do not affect the error-correction performance, only one graph is shown for that size. As L increases, the FER degradation due to SPC-8+ decoders increases. The gap is <0.1 dB for L=8, but grows to ≈0.25 dB when L is increased to 32. These results were obtained with a CRC of length 32 bits. FIG. 16 also shows the FER of the (2048,1723) LDPC code after 10 iterations of offset min-sum decoding for comparison. While using SPC-8+ constituent decoders degrade the error correction performance for larger L values, they decrease decoding latency as will be shown in the following section. Therefore, the decision regarding whether to employ them or not depends on the target FER and list size.

D.5.4 Latency and Throughput

To determine the latency improvement due to the new algorithm and implementation, the inventors compare in Table D1 two unrolled decoders with an LLR-based SC-list decoder implemented according to the prior art. The first unrolled decoder does not implement any specialized constituent decoders and is labeled "unrolled SC-list". While the other, labeled "unrolled Dec-SPC-4," implements all the constituent decoders described in this Section D of the specification, limiting the length of the SPC ones to four. The inventors observe that unrolling the SC list decoder decreases decoding latency by more than 50%. Furthermore, using the rate-0, rate-1, repetition, and SPC-4 constituent decoders decreases the latency to between 63% (L=2) and 18.9% (L=32) that of the unrolled SC-list decoder. The speed improvement gained by using the proposed decoding algorithm and implementation compared to SC-list decoding varies between 18.4 and 11.9 times at list sizes of 2 and 32, respectively. The impact of unrolling the decoder is more evident for smaller list sizes; whereas the new constituent decoders play a more significant role for larger lists.

TABLE D1

Latency (in ms) of decoding the (2048, 1723) polar-CRC code using the proposed method with different list sizes, with and without SPC decoders compared to that of SC-list decoder. Speedups compared to SC-List are shown in brackets

| Decoder | L | | |
|---|---|---|---|
| | 2 | 8 | 32 |
| SC-List | 558 | 1450 | 5145 |
| Unrolled SC-List | 193 (2.0×) | 564 (2.6×) | 2294 (2.2×) |
| Unrolled Dec-SPC-4 | 30.4 (18.4×) | 97.5 (14.9×) | 433 (11.9×) |
| Unrolled Dec-SPC-4+ | 26.3 (21.2×) | 80.2 (18.1×) | N/A |

Table I also shows the latency for the proposed decoder when no restriction on the length of the constituent SPC decoders is present, denoted "Unrolled Dec-SPC-4+". The inventors note that enabling these longer constituent decoder decreases latency by 14% and 18% for L=2 and 8, respectively. Due to the significant loss in error-correction performance, the inventors do not consider it appropriate to use the SPC-8+ constituent decoders for L>8 although there is no restriction to doing so and therefore do not list the latency of such a decoder configuration.

The throughput of the proposed decoder decreases almost linearly with L. For L=32 with a latency of 433 ms, the information throughput is 4.0 Mbps. As mentioned in Section D, throughput can be improved using adaptive decoding where a Fast-SSC decoder is used before the list decoder. The throughput results for this approach are shown for L=8 and L=32 in Table D.2. As $E_b/N_0$ increases, the Fast-SSC succeeds more often and the impact of the list decoder on throughput is decreased, according to Equation (57), until it is becomes negligible as can be observed at 4.5 dB where the throughput for both L=8 and L=32 is the same.

D.6. Comparison with LDPC Codes

D.6.1. Comparison with the (2048, 1723) LDPC Code

Figure 17:
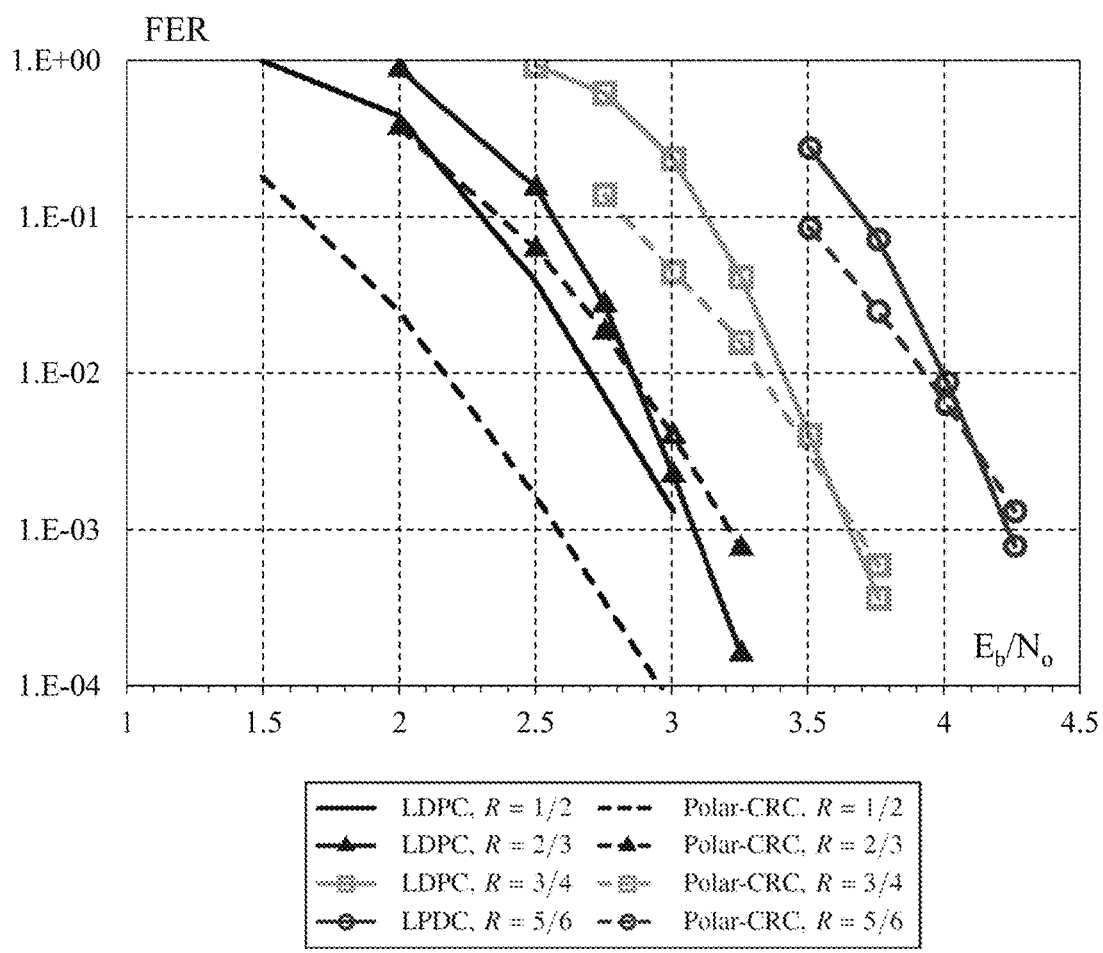
FIG. 17 depicts bit-error rate of decoders according to embodiments of the invention of length 1024 against those of the IEEE 802.11n standard of length 1944.

The inventors implemented a scaled min-sum decoder for the (2048, 1723) LDPC code of the prior art which to their knowledge, is the fastest software implementation of decoder for this code. The inventors employed early termination and maximum iteration count of 10. To match the error-correction performance at the same code length, an adaptive polar list-CRC decoder with a list size of 32 and a 32-bit CRC was used as shown in FIG. 17.

Table D3 presents the results of the speed comparison between the two decoders. It can be observed that the proposed polar decoder has lower latency and higher throughput throughout the entire $E_b/N_0$ range of interest. The throughput advantages widens from 7 to 78 times as the channel conditions improve from 3.5 dB to 4.5 dB. The LDPC decoder has three times the latency of the polar list decoder.

TABLE D3

Information throughput and latency of the inventor adaptive decoder with $L_{MAX} = 32$ compared to the (2048, 1723) LDPC decoder.

| Decoder | Latency (μs) | Throughput TIP (Mbps) | | |
|---|---|---|---|---|
| | | 3.5 dB | 4.0 dB | 4.5 dB |
| LDPC | 1.60 | 1.1 | 2.0 | 2.5 |
| Inventive Concept | 0.44 | 8.6 | 33.0 | 196.0 |

D.6.2. Comparison with the 802.11n LDPC Codes

The fastest software LDPC decoders known to the inventors are those that implement decoders for the 802.11n standard using the same Intel Core i7-2600 as the software implementations presented in this Section D for comparison purposes.

The standard defines three code lengths: 1944, 1296, 648; and four code rates: 1/2, 2/3, 3/4, 5/6. A prior art implemented decoders for codes of length 1944 and all four rates employed a layered offset-min-sum decoding algorithm with five iterations. Referring to FIG. 17 there are depicted the FER of these codes using a 10-iteration, flooding-schedule offset min-sum decoder that yields slightly better results than the five iteration layered decoder. FIG. 17 also shows the FER of polar-CRC codes (with 8-bit CRC) of the same rate, but shorter: N=1024 instead of 1944. As can be seen in FIG. 17, when these codes were decoded using a list CRC decoder with L=2, their FER remained within 0.1 dB of the LDPC codes. Specifically, for all codes but the one with rate 2/3, the polar-CRC codes have better FER than their LDPC counterparts down to at least FER=$2\times10^{-3}$. For a wireless communication system with retransmission such as 802.11, this constitutes the FER range of interest. These results show that the FER of N=1024 is sufficient and that it is unnecessary to use longer codes to improve it further.

The latency and throughput of the LDPC decoders are calculated for when 524,280 information bits are transferred using multiple LDPC codewords within the prior art. Table D4 compares the speed of LDPC and polar-CRC decoders when decoding that many bits on an Intel Core i7-2600 with turbo frequency boost enabled. The latency comprises the total time required to decode all bits in addition to copying them from and to the decoder memory. The results show that the proposed list-CRC decoders are faster than the LDPC ones. These prior art LPDC decoders meet the minimum regulated throughput requirements set in IEEE standards for codes of rate 1/2 and for two out of three cases when the rate is 3/4 (MCS indexes 2 and 3). The inventive decoder meets the minimum throughput requirements at all code rates. This shows that in this case, a software polar list decoder obtains higher speeds and similar FER to the LDPC decoder, but with a code about half as long. It should be noted that neither decoder employs early termination: the LDPC decoder within the prior art always uses 5 iteration, and the list-CRC decoder does not utilize adaptive decoding.

D.6 Summary

Within the preceding Section D the inventors have described an algorithm to significantly reduce the latency of polar list decoding, by an order of magnitude compared to the prior art when implemented in software. The inventors have also been able to show that polar list decoders may be suitable for software-defined radio applications as they can achieve high throughput, especially when using adaptive decoding. Furthermore, when compared with state-of-the art LDPC software decoders from wireless standards, the inventors demonstrated that polar codes could achieve at least the same throughput and similar FER, while using significantly shorter codes.

Within the preceding descriptions in respect of Sections A to D frozen bits have been described as being set to zero. Optionally, frozen bits may be set to some predetermined value other than zero.

Specific details are given in the above description to provide a thorough understanding of the embodiments. However, it is understood that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Implementation of the techniques, blocks, steps and means described above may be done in various ways. For example, these techniques, blocks, steps and means may be implemented in hardware, software, or a combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described above and/or a combination thereof.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be rearranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

Furthermore, embodiments may be implemented by hardware, software, scripting languages, firmware, middleware, microcode, hardware description languages and/or any combination thereof. When implemented in software, firmware, middleware, scripting language and/or microcode, the program code or code segments to perform the necessary tasks may be stored in a machine readable medium, such as a storage medium. A code segment or machine-executable instruction may represent a procedure, a function, a subprogram, a program, a routine, a subroutine, a module, a software package, a script, a class, or any combination of instructions, data structures and/or program statements. A code segment may be coupled to another code segment or a hardware circuit by passing and/or receiving information, data, arguments, parameters and/or memory content. Information, arguments, parameters, data, etc. may be passed, forwarded, or transmitted via any suitable means including memory sharing, message passing, token passing, network transmission, etc.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory. Memory may be implemented within the processor or external to the processor and may vary in implementation where the memory is employed in storing software codes for subsequent execution to that when the memory is employed in executing the software codes. As used herein the term "memory" refers to any type of long term, short term, volatile, nonvolatile, or other storage medium and is not to be limited to any particular type of memory or number of memories, or type of media upon which memory is stored.

Moreover, as disclosed herein, the term "storage medium" may represent one or more devices for storing data, including read only memory (ROM), random access memory (RAM), magnetic RAM, core memory, magnetic disk storage mediums, optical storage mediums, flash memory devices and/or other machine readable mediums for storing information. The term "machine-readable medium" includes, but is not limited to portable or fixed storage devices, optical storage devices, wireless channels and/or various other mediums capable of storing, containing or carrying instruction(s) and/or data.

The methodologies described herein are, in one or more embodiments, performable by a machine which includes one or more processors that accept code segments containing instructions. For any of the methods described herein, when the instructions are executed by the machine, the machine performs the method. Any machine capable of executing a set of instructions (sequential or otherwise) that specify actions to be taken by that machine are included. Thus, a typical machine may be exemplified by a typical processing system that includes one or more processors. Each processor may include one or more of a CPU, a graphics-processing unit, and a programmable DSP unit. The processing system further may include a memory subsystem including main RAM and/or a static RAM, and/or ROM. A bus subsystem may be included for communicating between the components. If the processing system requires a display, such a display may be included, e.g., a liquid crystal display (LCD). If manual data entry is required, the processing system also includes an input device such as one or more of an alphanumeric input unit such as a keyboard, a pointing control device such as a mouse, and so forth.

The memory includes machine-readable code segments (e.g. software or software code) including instructions for performing, when executed by the processing system, one of more of the methods described herein. The software may reside entirely in the memory, or may also reside, completely or at least partially, within the RAM and/or within the processor during execution thereof by the computer system. Thus, the memory and the processor also constitute a system comprising machine-readable code.

In alternative embodiments, the machine operates as a standalone device or may be connected, e.g., networked to other machines, in a networked deployment, the machine may operate in the capacity of a server or a client machine in server-client network environment, or as a peer machine in a peer-to-peer or distributed network environment. The machine may be, for example, a computer, a server, a cluster of servers, a cluster of computers, a web appliance, a distributed computing environment, a cloud computing environment, or any machine capable of executing a set of instructions (sequential or otherwise) that specify actions to be taken by that machine. The term "machine" may also be taken to include any collection of machines that individually or jointly execute a set (or multiple sets) of instructions to perform any one or more of the methodologies discussed herein.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method of encoding data comprising:
   inputting data to a first non-systematic polar encoder having a first pipeline defining a first input and a first output, and capable of encoding a polar code of length $n_{max}$;
   extracting, via at least one first multiplexer of size log $n_{max} \times 1$, a first polar code of length $n < n_{max}$ at a first location along the first pipeline upstream from the first output to generate a first encoded output;
   modifying the first encoded output to set frozen bits to a known value to obtain a modified first encoded output;
   inputting the modified first encoded output to a second non-systematic polar encoder having a second pipeline defining a second input and a second output, and capable of encoding a polar code of length $n_{max}$; and
   extracting, via at least one second multiplexer of size log $n_{max} \times 1$, a second polar code of length $n < n_{max}$ at a second location along the second pipeline upstream from the second output to generate a second encoded output, the second encoded output corresponding to a systematically encoded polar code of length n.

2. The method of claim 1, wherein the first non-systematic encoder and the second non-systematic encoder are a same non-systematic encoder.

3. The method of claim 1, wherein modifying the first output comprises applying masks to the first output, the masks having frozen bit locations set to the known value.

4. The method of claim 3, wherein applying masks comprises using P AND gates to apply the masks, wherein P corresponds to a level of parallelism for encoding the data.

5. The method of claim 3, wherein applying masks comprises selecting the frozen bit locations to bits with an index greater than n.

6. A system for encoding data comprising:
   at least one processing unit; and
   a non-transitory memory communicatively coupled to the at least one processing unit and comprising computer-readable program instructions executable by the at least one processing unit for:

inputting data to a first non-systematic polar encoder having a first pipeline defining a first input and a first output, and capable of encoding a polar code of length $n_{max}$;

extracting, via at least one first multiplexer of size log $n_{max} \times 1$, a first polar code of length $n < n_{max}$ at a first location along the first pipeline upstream from the first output to generate a first encoded output;

modifying the first encoded output to set frozen bits to a known value to obtain a modified first encoded output;

inputting the modified first encoded output to a second non-systematic polar encoder having a second pipeline defining a second input and a second output, and capable of encoding a polar code of length $n_{max}$; and extracting, via at least one second multiplexer of size log $n_{max} \times 1$, a second polar code of length $n < n_{max}$ at a second location along the second pipeline upstream from the second output to generate a second encoded output, the second encoded output corresponding to a systematically encoded polar code of length n.

7. The system of claim 6, wherein the first non-systematic encoder and the second non-systematic encoder are a same non-systematic encoder.

8. The system of claim 6, wherein modifying the first output comprises applying masks to the first output, the masks having frozen bit locations set to the known value.

9. The system of claim 8, wherein applying masks comprises using P AND gates to apply the masks, wherein P corresponds to a level of parallelism for encoding the data.

10. The system of claim 8, wherein applying masks comprises selecting the frozen bit locations to bits with an index greater than n.

11. A systematic encoder comprising:
a first non-systematic polar encoder having a first pipeline defining a first input and a first output, capable of encoding a polar code of length $n_{max}$, and configured for receiving input data and generating a first encoded output;

at least one mask applicable to the first encoded output to set frozen bits to a known value to obtain a modified first encoded output;

a second non-systematic polar encoder having a second pipeline defining a second input and a second output, capable of encoding a polar code of length $n_{max}$, and configured for receiving the modified first encoded output and generating a second encoded output, the encoded second output corresponding to a systematically encoded polar code of length $n < n_{max}$; and an extraction circuit comprising at least one first multiplexer of size log $n_{max} \times 1$ for extracting the polar code of length n at a location along the first pipeline of the first non-systematic encoder and the second pipeline of the second non-systematic encoder upstream from the first output and the second output, respectively.

12. The encoder of claim 11, wherein the first non-systematic encoder and the second non-systematic encoder are a same non-systematic encoder.

13. The encoder of claim 11, wherein the at least one mask comprises at least one AND gate.

14. The encoder of claim 11, wherein systematic encoder is a semi-parallel encoder defined by a level of parallelism P.

15. The encoder of claim 11, wherein the at least one mask is configured to set the frozen bits at frozen bits locations where bits have an index greater than n.

16. The method of claim 1, wherein the encoded polar code of length n is any length n that is less than $n_{max}$.

17. The system of claim 6, wherein the encoded polar code of length n is any length n that is less than $n_{max}$.

18. The systematic encoder of claim 11, wherein the encoded polar code of length n is any length n that is less than $n_{max}$.

* * * * *